United States Patent
Lee et al.

(10) Patent No.: US 12,027,225 B2
(45) Date of Patent: *Jul. 2, 2024

(54) MEMORY MODULES INCLUDING A MIRRORING CIRCUIT AND METHODS OF OPERATING THE SAME

(71) Applicant: SAMSUNG ELECTRONICS CO., LTD., Suwon-si (KR)

(72) Inventors: Gyuchae Lee, Suwon-si (KR); Kyudong Lee, Suwon-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/109,338

(22) Filed: Feb. 14, 2023

(65) Prior Publication Data

US 2023/0186954 A1    Jun. 15, 2023

Related U.S. Application Data

(63) Continuation of application No. 17/344,235, filed on Jun. 10, 2021, now Pat. No. 11,631,437, which is a
(Continued)

(30) Foreign Application Priority Data

Apr. 18, 2019  (KR) .................... 10-2019-0045389
Jun. 5, 2019   (KR) .................... 102019-0066569

(51) Int. Cl.
*G11C 5/06* (2006.01)
*G11C 5/04* (2006.01)
(Continued)

(52) U.S. Cl.
CPC ............ *G11C 5/04* (2013.01); *G11C 11/4074* (2013.01); *G11C 16/10* (2013.01); *G11C 16/30* (2013.01)

(58) Field of Classification Search
CPC ........... G11C 11/04; G11C 11/14; G11C 7/02; G11C 5/02; G11C 11/12; G11C 16/10; G11C 16/30
(Continued)

(56) References Cited

U.S. PATENT DOCUMENTS 5,838,627 A   11/1998   Tomishima et al.
6,188,634 B1   2/2001   Le
(Continued)

FOREIGN PATENT DOCUMENTS

CN    101286144    10/2008
CN    103946811     7/2014
(Continued)

OTHER PUBLICATIONS

Office Action dated Aug. 24, 2023 from the Chinese Patent Office for Chinese Patent Application No. 202010138598.6.

*Primary Examiner* — Son T Dinh
(74) *Attorney, Agent, or Firm* — F. Chau & Associates, LLC

(57) ABSTRACT

A memory module is provided including a plurality of semiconductor memory devices mounted on a circuit board. A control device is mounted on the circuit board and configured to receive a command signal, an address signal, and a clock signal and to provide the command signal, the address signal, and the clock signal to the plurality of semiconductor memory devices. A first group of the semiconductor memory devices is disposed between the control device and a first edge portion of the circuit board, and a second group of the semiconductor memory devices is disposed between the control device and a second edge portion of the circuit board. The control device is configured to transmit the address signal to the first group of the semiconductor memory devices and the second group of the semiconductor memory devices through a first transmission
(Continued)

line and a second transmission line, respectively. The first transmission line and the second transmission line are physically symmetric with respect to an axis intersecting the control device.

19 Claims, 18 Drawing Sheets

Related U.S. Application Data continuation of application No. 16/733,803, filed on Jan. 3, 2020, now Pat. No. 11,043,246.

(51) Int. Cl.
*G11C 11/4074* (2006.01)
*G11C 16/10* (2006.01)
*G11C 16/30* (2006.01)

(58) Field of Classification Search
USPC .......................................................... 365/63
See application file for complete search history.

(56) References Cited

U.S. PATENT DOCUMENTS

| | | |
|---|---|---|
| 7,253,457 B2 | 8/2007 | Hirose |
| 7,539,826 B2 | 5/2009 | Chae et al. |
| 7,821,127 B2 | 10/2010 | Lee et al. |
| 7,821,803 B2 | 10/2010 | Kim et al. |
| 8,180,939 B2 | 5/2012 | Kim et al. |
| 8,336,834 B2 | 12/2012 | Matsumoto et al. |
| 8,659,141 B2 | 2/2014 | Crisp et al. |
| 10,108,684 B2 | 10/2018 | Abraham et al. |
| 10,216,685 B1 | 2/2019 | Sartore et al. |
| 11,043,246 B2 | 6/2021 | Lee et al. |
| 11,631,437 B2 * | 4/2023 | Lee .................. G11C 11/4074 711/149 |
| 2002/0001215 A1 | 1/2002 | Fujisawa et al. |
| 2004/0186945 A1 | 9/2004 | Jeter, Jr. et al. |
| 2008/0256305 A1 | 10/2008 | Kwon et al. |
| 2010/0182817 A1 | 7/2010 | Koshizuka |
| 2013/0275682 A1 | 10/2013 | Ramanujan et al. |
| 2013/0322162 A1 | 12/2013 | Lee et al. |
| 2015/0331817 A1 | 11/2015 | Han et al. |
| 2017/0201243 A1 | 7/2017 | Hu et al. |
| 2018/0158494 A1 | 6/2018 | Park |
| 2018/0189153 A1 | 7/2018 | Ahn |
| 2018/0341588 A1 | 11/2018 | Ramanujan et al. |
| 2019/0348400 A1 | 11/2019 | Suzuki et al. |
| 2020/0335139 A1 | 10/2020 | Lee et al. |
| 2021/0304800 A1 | 9/2021 | Lee et al. |

FOREIGN PATENT DOCUMENTS

| | | |
|---|---|---|
| CN | 103946826 | 7/2014 |
| CN | 108172251 | 6/2018 |
| CN | 108279998 | 7/2018 |
| CN | 109545253 | 3/2019 |
| JP | 2001-024146 | 1/2001 |
| JP | 2005-117062 | 4/2005 |
| KR | 10-0454123 | 10/2004 |
| KR | 10-0564621 | 3/2006 |

* cited by examiner

○ Populated ball
+ Ball not populated

MEMORY MODULES INCLUDING A MIRRORING CIRCUIT AND METHODS OF OPERATING THE SAME

CROSS-REFERENCE TO RELATED APPLICATIONS

This application is a continuation of U.S. patent application Ser. No. 17/344,235 filed on Jun. 10, 2021, which is a continuation of U.S. patent application Ser. No. 16/733,803 filed on Jan. 3, 2020, now U.S. Pat. No. 11,043,246 issued on Jun. 22, 2021, which claims priority under 35 U.S.C. § 119 to Korean Patent Application No. 10-2019-0045389 filed on Apr. 18, 2019 in the Korean Intellectual Property Office and Korean Patent Application No. 10-2019-0066569 filed on Jun. 5, 2019 in the Korean Intellectual Property Office, the disclosures of which are incorporated by reference herein in their entireties.

TECHNICAL FIELD

The present inventive concept relates to memory modules, and more particularly, to memory modules including a mirroring circuit and methods of operating the memory modules.

DISCUSSION OF THE RELATED ART

A memory device may be implemented using a semiconductor such as silicon (Si), germanium (Ge), gallium arsenide (GaAs), indium phosphide (InP), or the like. Memory devices are typically either a volatile memory device or a nonvolatile memory device.

A volatile memory device is a memory device in which stored data is lost in the absence of a power supply. A nonvolatile memory device is a memory device that retains stored data even in the absence of power. Because a dynamic random access memory (DRAM), which is a kind of volatile memory device, has a high access speed, the DRAM is widely used as a working memory, a buffer memory, a main memory, or the like of a computing system. Because a DRAM memory cell generally includes a capacitor and a transistor, a reduction in cell size is limited. Thus, a high-capacity DRAM may not be implemented within a limited area. To achieve high capacity, a plurality of DRAMs may be provided in a memory module. However, address signals may not be efficiently transmitted in the memory module.

SUMMARY

According to an exemplary embodiment of the present inventive concept, a memory module is provided including a plurality of semiconductor memory devices mounted on a circuit board. A control device is mounted on the circuit board and configured to receive a command signal, an address signal, and a clock signal and to provide the command signal, the address signal, and the clock signal to the plurality of semiconductor memory devices. A first group of the semiconductor memory devices is disposed between the control device and a first edge portion of the circuit board, and a second group of the semiconductor memory devices is disposed between the control device and a second edge portion of the circuit board. The control device is configured to transmit the address signal to the first group of the semiconductor memory devices and the second group of the semiconductor memory devices through a first transmission line and a second transmission line, respectively. The first transmission line and the second transmission line are physically symmetric with respect to an axis intersecting the control device.

According to an exemplary embodiment of the present inventive concept, the first edge portion and the second edge portion extend in a first direction. The first group of the semiconductor memory devices is disposed in a second direction crossing the first direction between the control device and the first edge portion. The second group of the semiconductor memory devices is disposed in the second direction between the control device and the second edge portion. Each of the first group of the semiconductor memory devices and each of the second group of the semiconductor memory devices have the same pin configuration along the first direction and the second direction.

According to an exemplary embodiment of the present inventive concept, a selected portion of the first group of the semiconductor memory devices and the second group of the semiconductor memory devices receive the address signal in a mirrored mode, and an unselected portion of the first group of the semiconductor memory devices and the second group of the semiconductor memory devices receive the address signal in a standard mode.

According to an exemplary embodiment of the present inventive concept, each mirror pin of a selected portion of the first group of the semiconductor memory devices and the second group of the semiconductor memory devices is connected to a power supply voltage. Each of the semiconductor memory devices of the selected portion receives the address signal in a mirrored mode. Each mirror pin of an unselected portion of the first group of the semiconductor memory devices and the second group of the semiconductor memory devices is connected to a ground voltage, and each of the semiconductor memory devices of the unselected portion receives the address signal in a standard mode.

According to an exemplary embodiment of the present inventive concept, each of the semiconductor memory devices of the selected portion is configured to swap at least some bits of the address signal in the mirrored mode.

According to an exemplary embodiment of the present inventive concept, each of the semiconductor memory devices of the selected portion is configured to swap an even numbered column address of the address signal with a next higher odd numbered column address of the address signal in the mirrored mode.

According to an exemplary embodiment of the present inventive concept, the control device includes a plurality of pins. The plurality of pins is disposed symmetrically with respect to the axis intersecting the control device in the first direction. The control device is configured to transmit the same bit of the address signal to the first group of the semiconductor memory devices and the second group of the semiconductor memory devices through a first address pin and a second address pin of the plurality of pins. The first address pin and the second address pin are adjacent to each other.

According to an exemplary embodiment of the present inventive concept, at least one semiconductor memory device from the first group of the semiconductor memory devices and the second group of the semiconductor memory devices includes a selective address mirroring circuit. The selective address mirroring circuit is connected to a mirror pin and is configured to selectively change the address signal to a corresponding mirrored address signal based on a voltage level of the mirror pin.

According to an exemplary embodiment of the present inventive concept, the selective address mirroring circuit is configured to operate in a mirrored mode to change some bits of the address signal to corresponding mirrored address bits when the mirror pin is connected to a power supply voltage.

According to an exemplary embodiment of the present inventive concept, the selective address mirroring circuit is configured to operate in a standard mode to maintain bits of the address signal when the mirror pin is connected to a ground voltage.

According to an exemplary embodiment of the present inventive concept, the selective address mirroring circuit includes a plurality of sub-address mirroring circuits, and each of the plurality of sub-address mirroring circuits receives some bits of the address signal in units of a mirroring pair. Each of the plurality of sub-address mirroring circuits is configured to selectively swap a first address bit and a second address bit based on a voltage level of the mirror pin. The first address bit and the second address bit constitute the mirroring pair.

According to an exemplary embodiment of the present inventive concept, the sub-address mirroring circuit includes a first p-channel metal oxide (PMOS) transistor. The PMOS transistor has a first electrode coupled to a first node and receives the first address bit, a gate coupled to a third node coupled to the mirror pin and a second electrode coupled to a fourth node and provides a first internal address bit. A second PMOS transistor has a first electrode coupled to a second node and receives the second address bit, a gate coupled to the third node and a second electrode coupled to a fifth node and provides a second internal address bit. A first n-channel metal oxide (NMOS) transistor has a first electrode coupled to the second node and receives the second address bit, a gate coupled to the third node and a second electrode coupled to the fourth node. A second NMOS transistor has a first electrode coupled to the first node and receives the first address bit, a gate coupled to the third node and a second electrode coupled to the fifth node.

According to an exemplary embodiment of the present inventive concept, when the mirror pin is connected to a power supply voltage, the sub-address mirroring circuit is configured to swap the first address bit and the second address bit to provide the second address bit and the first address bit as the first internal address bit and the second internal address bit, respectively.

According to an exemplary embodiment of the present inventive concept, the first address bit corresponds to an even numbered bit of a column address of the address signal; and the second address bit corresponds to a next higher odd numbered bit of the column address.

According to an exemplary embodiment of the present inventive concept, when the mirror pin is connected to a ground voltage, the sub-address mirroring circuit is configured to maintain the first address bit and the second address bit to provide the first address bit and the second address bit as the first internal address bit and the second internal address bit, respectively.

According to an exemplary embodiment of the present inventive concept, each of the plurality of semiconductor memory devices is a double data rate 5 (DDR5) synchronous dynamic random access memory (SDRAM).

According to an exemplary embodiment of the present inventive concept, a method of operating a memory module is provided, wherein the memory module includes a plurality of semiconductor memory devices mounted on a circuit board and a control device to control the plurality of semiconductor memory devices. The plurality of semiconductor memory devices includes a first group of semiconductor memory devices disposed between the control device and a first edge portion of the circuit board and a second group of semiconductor memory devices disposed between the control device and a second edge portion of the circuit board. The method includes receiving, by the first group of semiconductor memory devices and the second group of semiconductor memory devices, an address signal through the control device. Whether one group of the first group of semiconductor memory devices and the second group of semiconductor memory devices operate in a mirrored mode is determined.

In each of the first group of semiconductor memory devices, the address signal is changed to a corresponding mirrored address signal when the first group of semiconductor memory devices operates in the mirrored mode. In each of the first group of semiconductor memory devices, a memory access is performed based on the mirrored address signal. The control device is configured to transmit the address signal to the first group of semiconductor memory devices and the second group of semiconductor memory devices through a first transmission line and a second transmission line, respectively. The first transmission line and the second transmission line are symmetric with respect to the control device.

According to an exemplary embodiment of the present inventive concept, determining whether one group of the first group of semiconductor memory devices and the second group of semiconductor memory devices operate in a mirrored mode includes determining whether a mirror pin of each of the semiconductor memory devices of the first group of is connected to a power supply voltage. Changing the address signal includes swapping an even numbered column address of the address signal with a next higher odd numbered column address of the address signal.

According to an exemplary embodiment of the present inventive concept, a plurality of semiconductor memory devices is mounted on a circuit board. A control device is mounted on the circuit board and configured to receive a command signal, an address signal, and a clock signal from an external device and to provide the command signal, the address signal, and the clock signal to the plurality of semiconductor memory devices. The plurality of semiconductor memory devices includes a first group of semiconductor memory devices disposed between the control device and a first edge portion of the circuit board, and a second group of semiconductor memory devices disposed between the control device and a second edge portion of the circuit board. The control device is configured to transmit the address signal to the first group of semiconductor memory devices and the second group of semiconductor memory devices through a first transmission line and a second transmission line, respectively. The first transmission line and the second transmission line are physically symmetric with respect to an axis intersecting the control device. Each semiconductor memory device of the first group and each semiconductor memory device of the second group of semiconductor memory devices have the same pin configuration along a first direction and a second direction. The control device includes a plurality of pins. The plurality of pins are disposed symmetrically with respect to a center line crossing the control device in the first direction. The control device is configured to transmit the same bit of the address signal to the first group of semiconductor memory devices and the second group of semiconductor memory devices through a first address pin and a second address pin of the plurality of pins, wherein the first address pin and the second address pin are opposite to each other.

According to an exemplary embodiment of the present inventive concept, each of the first group of semiconductor memory devices and the second group of semiconductor memory devices includes a selective address mirroring circuit. The selective address mirroring circuit is connected to a mirror pin and is configured to selectively change the address signal to a corresponding mirrored address signal based on a voltage level of the mirror pin. The selective address mirroring circuit is configured to operate in a mirrored mode to change some bits of the address signal to corresponding mirrored address bits when the mirror pin is connected to a power supply voltage.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
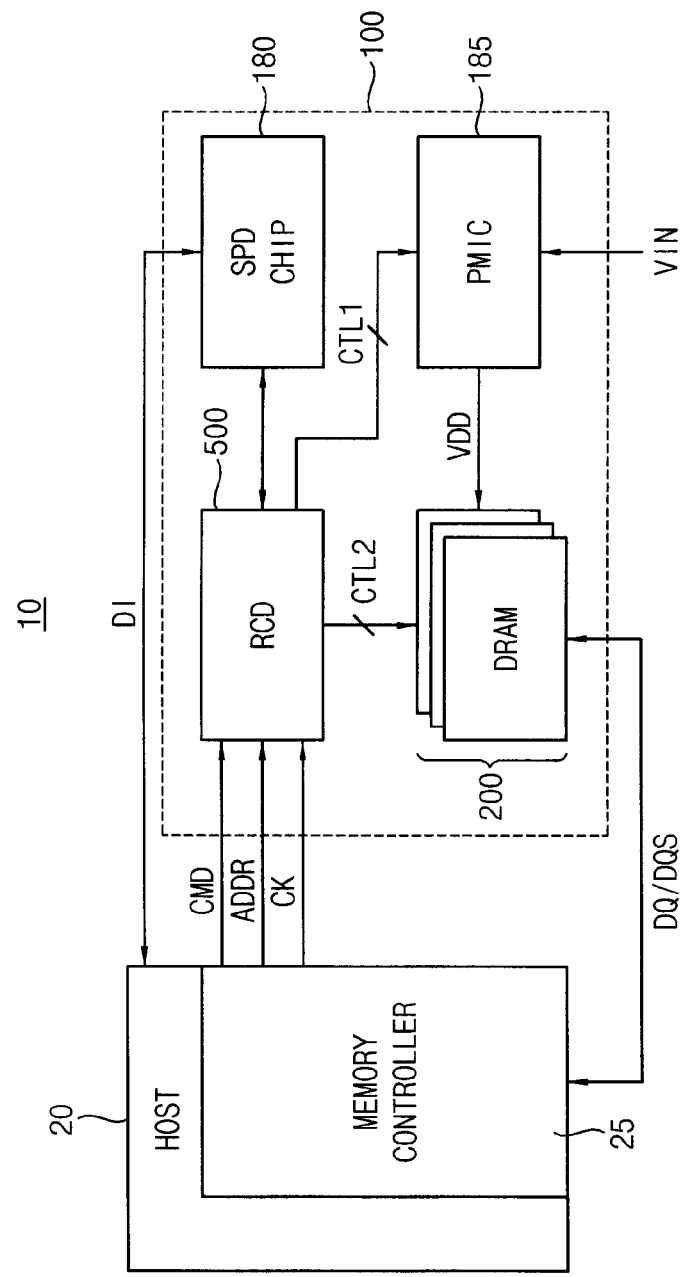
FIG. 1 is a block diagram illustrating a memory system according to an exemplary embodiment of the present inventive concept.

Exemplary embodiments of the present inventive concept will be described more fully hereinafter with reference to the accompanying drawings. Like reference numerals may refer to like elements throughout this application.

FIG. 1 is a block diagram illustrating a memory system according to an exemplary embodiment of the present inventive concept.

Referring to FIG. 1, a memory system 10 includes a host 20 and a memory module 100. The host 20 may include a memory controller 25. The host 20 may be connected to the memory module 100 through the memory controller 25. For example, the memory controller 25 may be connected a control device 500 and a plurality of semiconductor memory devices 200.

The memory module 100 may include the control device 500, a serial presence detect (SPD) chip 180, a power management integrated circuit (PMIC) 185, and semiconductor memory devices 200. The control device 500 may be a registered clock driver (RCD).

The control device 500 may control the semiconductor memory devices 200 and the PMIC 185 under control of the memory controller 25. For example, the control device 500 may receive an address ADDR, a command CMD, and a clock signal CK from the memory controller 25.

In response to received signals, the control device 500 may control the semiconductor memory devices 200 such that data received through a data signal DQ and a data strobe signal DQS is written in the semiconductor memory devices 200, or such that data stored in the semiconductor memory devices 200 is output through the data signal DQ and the data strobe signal DQS.

For example, the control device 500 may transmit the address ADDR, the command CMD, and the clock signal CK received from the memory controller 25 to the semiconductor memory devices 200.

The semiconductor memory devices 200 may write data received through the data signal DQ and the data strobe signal DQS under control of the control device 500. The semiconductor memory devices 200 may output the written data through the data signal DQ and the data strobe signal DQS under the control of the control device 500.

For example, the semiconductor memory devices 200 may include a volatile memory device such as a dynamic random-access memory (DRAM), a static RAM (SRAM), or a synchronous DRAM (SDRAM). For example, the semiconductor memory devices 200 may be DRAM-based volatile memory devices. The semiconductor memory devices 200 may include a double data rate 5 (DDR5) SDRAM.

The SPD chip 180 may be a programmable read-only memory (e.g., EEPROM). The SPD chip 180 may include initialization information or device information DI of the memory module 100. In exemplary embodiments of the present inventive concept, the SPD chip 180 may include the initialization information or the device information DI such as a module form, a module configuration, a storage capacity, a module type, an execution environment, or the like of the memory module 100.

When the memory system 10 including the memory module 100 is booted up, the host 20 may read the device information DI from the SPD chip 180 and may recognize the memory module 100 based on the device information DI. The host 20 may control the memory module 100 based on the device information DI from the SPD chip 180. For example, the host 20 may recognize a type of the semiconductor memory devices 200 included in the memory module 100 based on the device information DI from the SPD chip 180.

In exemplary embodiments of the present inventive concept, the SPD chip 180 may communicate with the host 20 through a serial bus. For example, the host 20 may exchange a signal with the SPD chip 180 through the serial bus. The SPD chip 180 may also communicate with the control device 500 through the serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

The control device 500 may control the PMIC 185 through a first control signal CTL1, and may control the semiconductor memory devices 200 through a second control signal CTL2. The second control signal CTL2 may include the address ADDR, the command CMD, and the clock signal CK.

The PMIC 185 receives an input voltage VIN, generates a power supply voltage VDD based on the input voltage VIN, and provides the power supply voltage VDD to the semiconductor memory devices 200. The semiconductor memory devices 200 operate based on the power supply voltage VDD.

Figure 2:
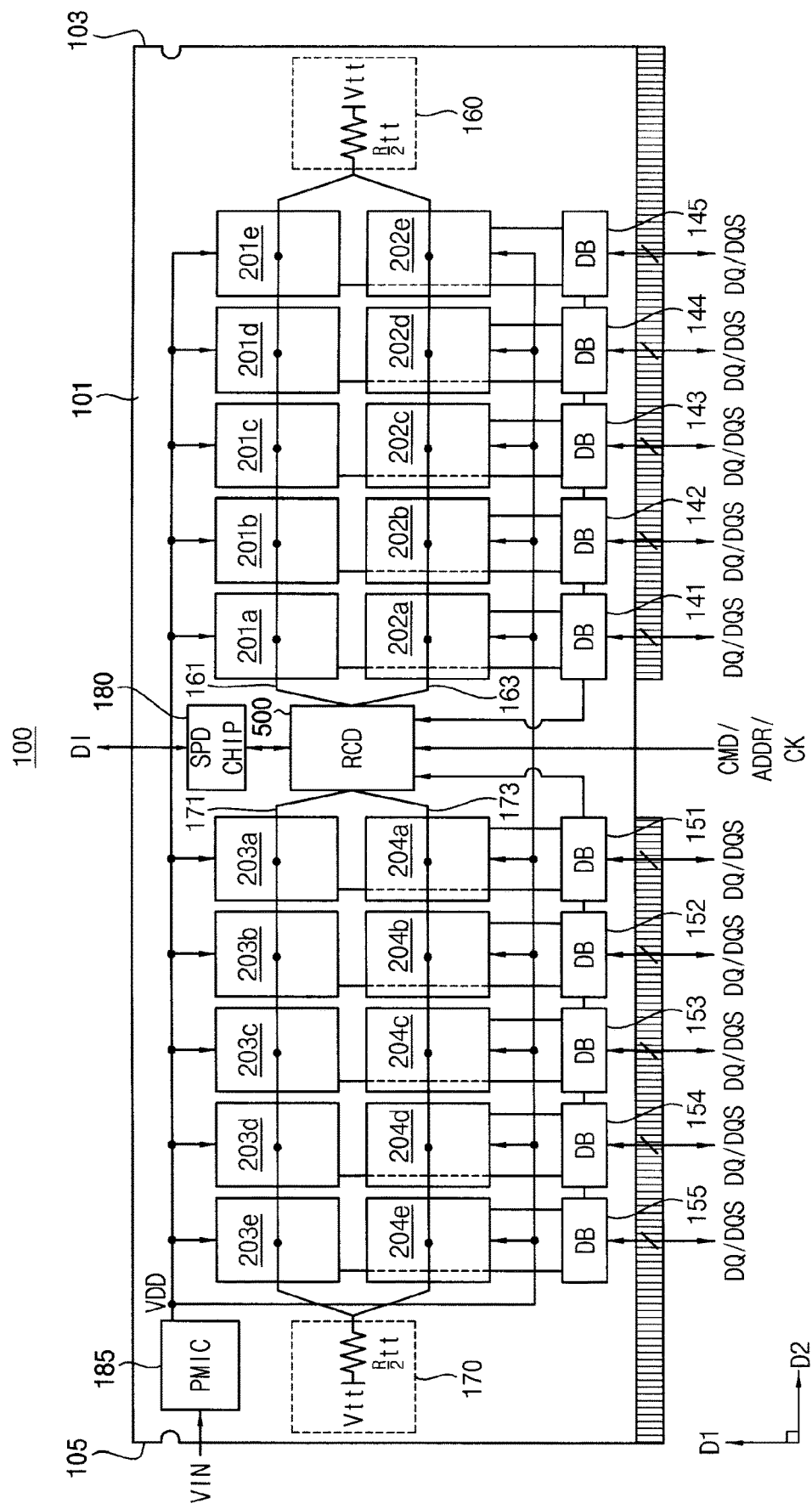
FIG. 2 is a block diagram illustrating a memory module in FIG. 1 in detail according to an exemplary embodiment of the present inventive concept.

FIG. 2 is a block diagram illustrating the memory module in FIG. 1 in detail according to an exemplary embodiment of the present inventive concept.

Referring to FIG. 2, the memory module 100 includes the control device 500 disposed in or mounted on a circuit board 101, a plurality of semiconductor memory devices 201, 202, 203 and 204 (each of which may be provided in plural), a plurality of data buffers (DB) 141, 142, 143, 144, 145 and 151, 152, 153, 154, 155, module resistance units 160 and 170, the SPD chip 180, and the PMIC 185.

The circuit board 101, which is a printed circuit board, may extend in a plane defined by a second direction (e.g., a D2 direction) and a first direction (e.g., a D1 direction). The second direction (e.g., the D2 direction) and the first direction (e.g., the D1 direction) may be perpendicular axes. The circuit board 101 may extend in the second direction (e.g., the D2 direction) from a first edge portion 103 to a second edge portion 105. The first edge portion 103 and the second edge portion 105 may extend in the first direction (e.g., the D1 direction).

The control device 500 may be disposed on a center of the circuit board 101. The semiconductor memory device 201 and the semiconductor memory device 202 may have a plurality of semiconductor memory devices 201a, 201b, 201c, 201d, 201e and 202a, 202b, 202c, 202d, 202e, respectively, arranged in a plurality of rows spaced in the first direction (e.g., the D1 direction). For example, units of the semiconductor memory device 201 and the semiconductor memory device 202 may be disposed in a first row and a second row, respectively. The first row and the second row may each extend in the second direction (e.g., the D2 direction). In addition, the first row and the second row may overlap a same first lateral surface of the control device 500 and may be disposed between the control device 500 and the first edge portion 103.

The semiconductor memory device 203 and the semiconductor memory device 204 may have a plurality of semiconductor memory devices 203a, 203b, 203c, 203d, 203e and 204a, 204b, 204c, 204d, 204e, respectively. The semiconductor memory devices 203 and the semiconductor memory devices 204 may be disposed in a separate third and a fourth row which may have symmetrical arrangements to the first row and the second row, respectively. The third row and the fourth row may be disposed between the control device 500 and the second edge portion 105.

In this case, the semiconductor memory devices 201 and the semiconductor memory devices 202 may be arranged along a plurality of rows between the control device 500 and the first edge portion 103. The semiconductor memory devices 203 and 204 may be arranged along a plurality of rows between the control device 500 and the second edge portion 105. The semiconductor memory device 201 and 202 may be referred to as a first group of semiconductor memory devices or a first channel of semiconductor memory devices and the semiconductor memory devices 203 and 204 may be referred to as a second group of semiconductor memory devices or a second channel of semiconductor memory devices.

A portion of the semiconductor memory devices 201 and the semiconductor memory devices 202 may be an error correction code (ECC) memory device. The ECC memory device may perform an ECC encoding operation to generate parity bits about data to be written to at least one of the semiconductor memory devices of the plurality of semiconductor memory devices 201, 202, 203, and 204, and an ECC decoding operation to correct an error occurring in the data read from the semiconductor memory devices.

Each of the plurality of semiconductor memory devices 201, 202, 203, and 204 may be coupled to a corresponding one of the data buffers 141, 141, 143, 144, 145 and 151, 152, 153, 154, 155 through a data transmission line for receiving/transmitting the data signal DQ and the data strobe signal DQS.

The control device 500 may provide a command/address signal CMD/ADDR to the semiconductor memory device 201 through a command/address transmission line 161 and may provide a command/address signal CMD/ADDR to the semiconductor memory device 202 through a command/address transmission line 163.

In addition, the control device 110 may provide a command/address signal CMD/ADDR to the semiconductor memory device 203 through a command/address transmission line 171 and may provide a command/address CMD/

ADDR signal to the semiconductor memory devices 204 through a command/address transmission line 173.

The command/address transmission line 161 and the command/address transmission line 163 may be connected in common to the module resistance unit 160 disposed adjacent to the first edge portion 103. For example, the module resistance unit 160 may be disposed between the first edge portion 103 and the first row and the second row. The command/address transmission line 171 and the command/address transmission line 173 may be connected in common to the module resistance unit 170 disposed adjacent to the second edge portion 105. For example, the module resistance unit 170 may be disposed between the second edge portion 105 and the third row and the fourth row.

According to an exemplary embodiment of the present inventive concept, the command/address transmission line 161 and the command/address transmission line 163 may be symmetrical, about an axis parallel to the second direction (e.g., the DR2 direction). In addition, the command/address transmission line 171 and the command/address transmission line 173 may be symmetrical, about an axis parallel to the second direction (e.g., the DR2 direction).

Each of the module resistance unit 160 and the module resistance unit 170 may include a termination resistor Rtt/2 connected to a termination voltage Vtt. In this case, an arrangement of the module resistance unit 160 and the module resistance unit 170 may reduce the number of the module resistance units, thus reducing an area where termination resistors are disposed.

In addition, each of the plurality of semiconductor memory devices 201, 202, 203, and 204a may be a DDR5 SDRAM.

The SPD chip 180 is disposed adjacent to the control device 500. For example, the SPD chip 180 may be aligned with the control device 500 in the first direction (e.g., the DR1 direction) and disposed between the first group of semiconductor memory devices and the second group of semiconductor memory devices. The PMIC 185 may be disposed between an outermost semiconductor memory device of the third row (e.g., the semiconductor memory device 203e) and the second edge portion 105. The PMIC 185 may generate the power supply voltage VDD based on the input voltage VIN and may provide the power supply voltage VDD to the semiconductor memory devices 201, 202, 203, and 204.

Although it is illustrated that the PMIC 185 is disposed adjacent to the second edge portion 105 in FIG. 2, the present inventive concept is not limited thereto. For example, the PMIC 185 may be disposed in a central portion of the circuit board 101 to be adjacent to the control device 500 and/or the SPD chip 180.

Each of the semiconductor memory devices 201, 202, 203, and 204 may include a mirror pin. When the mirror pin is connected to a power supply voltage VDD, each of the semiconductor memory devices 201, 202, 203, and 204 operate in a mirrored mode. When the mirror pin is connected to a ground, each of the semiconductor memory devices 201, 202, 203, and 204 operate in a standard mode.

Each of the semiconductor memory devices 201, 202, 203, and 204 may change an address signal ADDR received from the external device to a corresponding mirrored address signal and may provide the mirrored address signal to each of the semiconductor memory devices 201, 202, 203, and 204 in the mirrored mode. Each of the semiconductor memory devices 201, 202, 203, and 204 may swap some bits of the address signal ADDR with corresponding address bits in the mirrored mode. Routing for the first group of semiconductor memory devices 201 and 202 which are disposed between the control device 500 and the first edge portion 103 and the second group of semiconductor memory devices 203 and 204 which are disposed between the control device 500 and the second edge portion 105 may be physically symmetric with respect to the control device 500.

The control device 500 the control device 500 may transmit the address signal ADDR to the first group of semiconductor memory devices 201 and 202 and the second group of semiconductor memory devices 203, and 204 through a first transmission line and a second transmission line, respectively, which are physically symmetric with respect to the control device 500, respectively. For example, the first transmission line (e.g., the command/address transmission line 161 or 163) and the second transmission line (e.g., the command/address transmission line 171 or 173) may be symmetrical about an imaginary line extending in the first direction (e.g., the DR1 direction) and bisecting the control device 500.

According to an exemplary embodiment of the present invention, the first command/address transmission lines 161 and 163 may be symmetric about an axis bisecting the control device 500 in the second direction (e.g., the DR2 direction). Additionally, the second command/address transmission lines 171 and 173 may be symmetric about the axis bisecting the control device 500 in the second direction (e.g., the DR2 direction).

Figure 3:
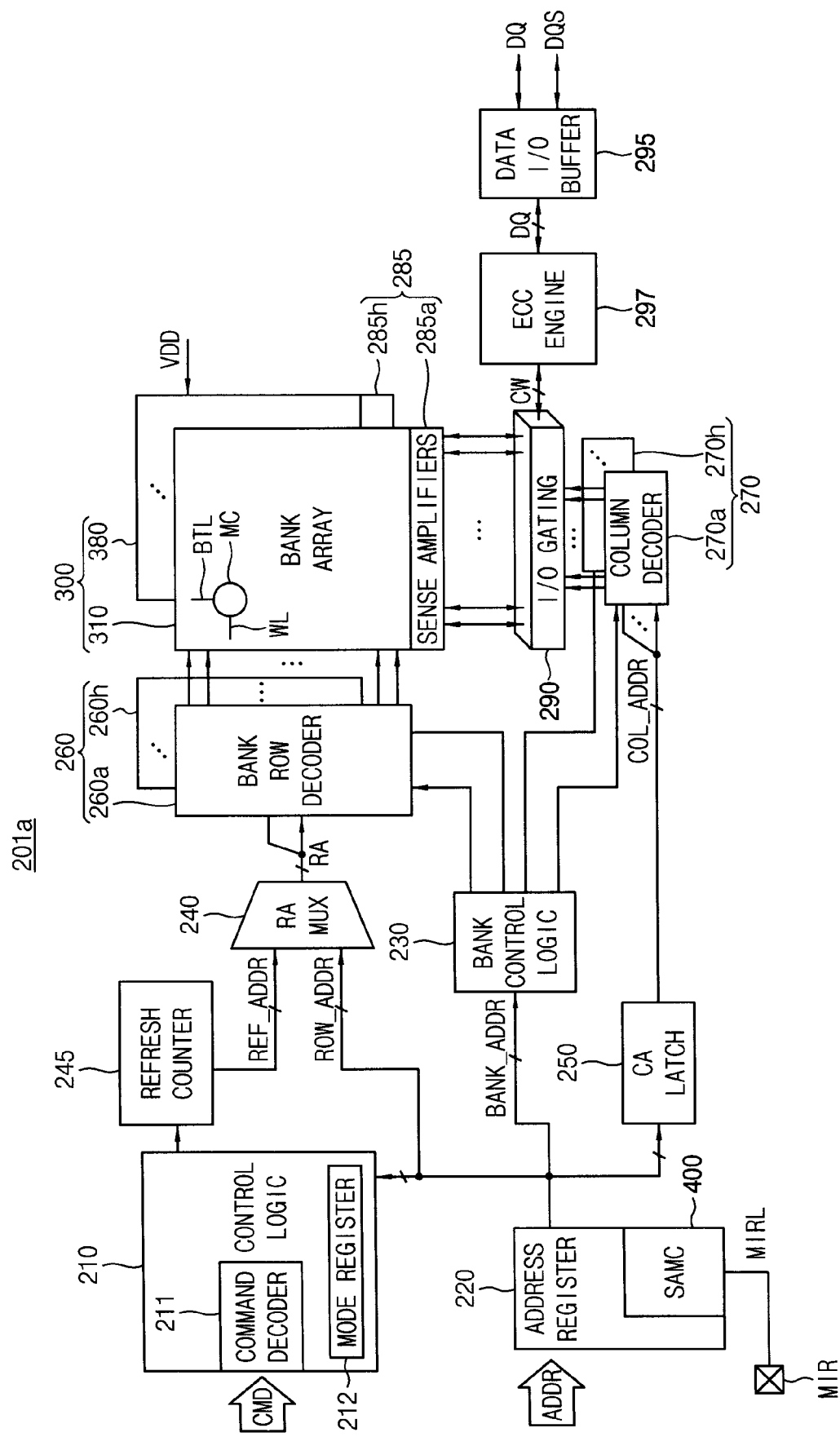
FIG. 3 is a block diagram illustrating one of the semiconductor memory devices in the memory module of FIG. 2 according to an exemplary embodiment of the present inventive concept.

FIG. 3 is a block diagram illustrating the semiconductor memory device 201a in the memory module 100 of FIG. 2 according to exemplary embodiments of the present inventive concept. However, although FIG. 3 shows the structure of the semiconductor memory device 201a, the structure depicted with reference to FIG. 3 may be applicable to other semiconductor memory devices 202, 203 and 204.

Referring to FIG. 3, the semiconductor memory device 201a may include a control logic circuit 210, an address register 220, a bank control logic circuit 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245 and an ECC engine 297.

The memory cell array 300 may include first through eighth bank arrays 310, 320, 330, 340, 350, 360, 370 and 380.

The memory cell array 300 may operate based on the power supply voltage VDD.

The row decoder 260 may include first through eighth bank row decoders 260a, 260b, 260c, 260d, 260e, 260f, 260g and 260h coupled to the first through eighth bank arrays 310, 320, 330, 340, 350, 360, 370 and 380, respectively, the column decoder 270 may include first through eighth bank column decoders 270a, 270b, 270c, 270d, 270e, 270f, 270g and 270h coupled to the first through eighth bank arrays 310, 320, 330, 340, 350, 360, 370 and 380, respectively, and the sense amplifier unit 285 may include first through eighth bank sense amplifiers 285a, 285b, 285c, 285d, 285e, 285f, 285g and 285h coupled to the first through eighth bank arrays 310, 320, 330, 340, 350, 360, 370 and 380, respectively.

The first through eighth bank arrays 310, 320, 330, 340, 350, 360, 370 and 380, the first through eighth bank row decoders 260a, 260b, 260c, 260d, 260e, 260f, 260g and 260h, the first through eighth bank column decoders 270a, 270b, 270c, 270d, 270e, 270f, 270g and 270h, and the first through eighth bank sense amplifiers 285a, 285b, 285c, 285d, 285e, 285f, 285g and 285h may form first through eighth banks. Each of the first through eighth bank arrays 310, 320, 330, 340, 350, 360, 370 and 380 may include a plurality of word-lines WL, a plurality of bit-lines BTL, and a plurality of memory cells MC formed at intersections of the word-lines WL and the bit-lines BTL.

Although the semiconductor memory device 201*a* is illustrated in FIG. 3 as including eight banks, the semiconductor memory device 201*a* may include any number of banks.

The address register 220 may receive the address ADDR including a bank address BANK_ADDR, a row address ROW_ADDR, and a column address COL_ADDR from the control device 500. The address register 220 may provide the received bank address BANK_ADDR to the bank control logic 230, may provide the received row address ROW_ADDR to the row address multiplexer 240, and may provide the received column address COL_ADDR to the column address (CA) latch 250.

The address register 220 may include a selective address mirroring circuit (SAMC) 400.

The SAMC 400 is connected to a mirror pin MIR and may operate either in a mirrored mode or in a standard mode based on a voltage level MIRL of the mirror pin MIR. If the mirror pin MIR is connected to a power supply voltage VDD, the SAMC 400 operates in the mirrored mode and changes some bits of the address signal ADDR, which are not used for setting the command, to corresponding mirrored address bits. If the mirror pin MIR is connected to a ground voltage, the SAMC 400 operates in the standard mode and maintains bits of the address signal ADDR.

The bank control logic 230 may generate bank control signals in response to the bank address BANK_ADDR. One of the first through eighth bank row decoders 260*a*, 260*b*, 260*c*, 260*d*, 260*e*, 260*f*, 260*g* and 260*h* corresponding to the bank address BANK_ADDR may be activated in response to the bank control signals, and one of the first through eighth bank column decoders 270*a*, 270*b*, 270*c*, 270*d*, 270*e*, 270*f*, 270*g* and 270*h* corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260*a*, 260*b*, 260*c*, 260*d*, 260*e*, 260*f*, 260*g* and 260*h*.

The activated one of the first through eighth bank row decoders 260*a*, 260*b*, 260*c*, 260*d*, 260*e*, 260*f*, 260*g* and 260*h* may decode the row address RA that is output from the row address multiplexer 240, and may activate a word-line WL corresponding to the row address RA. For example, the activated bank row decoder may generate a word-line driving voltage based on the power supply voltage VDD and may apply the word-line driving voltage to the word-line WL corresponding to the row address RA.

The column address latch 250 may receive the column address COL_ADDR from the address register 220, and may temporarily store the received column address COL_ADDR. In exemplary embodiments of the present inventive concept, in a burst mode, the column address latch 250 may generate column addresses that increment from the received column address COL_ADDR. The column address latch 250 may apply the temporarily stored or generated column address to the first through eighth bank column decoders 270*a*, 270*b*, 270*c*, 270*d*, 270*e*, 270*f*, 270*g* and 270*h*.

The activated one of the first through eighth bank column decoders 270*a*, 270*b*, 270*c*, 270*d*, 270*e*, 270*f*, 270*g* and 270*h* may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310, 320, 330, 340, 350, 360, 370 and 380, and write control devices for writing data to the first through eighth bank arrays 310, 320, 330, 340, 350, 360, 370 and 380.

Data to be read from one of the first through eighth bank arrays 310, 320, 330, 340, 350, 360, 370 and 380 may be sensed by a sense amplifier coupled to the one bank array from which the data is to be read, and may be stored in the read data latches.

The data stored in the read data latches may be provided to the memory controller 25 via the data I/O buffer 295 after the ECC engine 297 performs an ECC decoding on the data (e.g., a codeword CW). Data to be written in one of the first through eighth bank arrays 310, 320, 330, 340, 350, 360, 370 and 380 may be provided to the data I/O buffer 295 from the memory controller 25. The ECC engine 297 performs an ECC encoding on the data provided to the data I/O buffer 295, and the ECC engine 297 provides the encoded data (e.g., the codeword CW) to the I/O gating circuit 290.

The data I/O buffer 295, in a write operation, provides the data signal DQ to the ECC engine 297. The data I/O buffer 295, in a read operation, receives the data signal DQ from the ECC engine 297 and provides the data signal DQ and the date strobe signal DQS to the memory controller 25.

The control logic circuit 210 may control operations of the semiconductor memory device 201*a*. For example, the control logic circuit 210 may generate control signals for the semiconductor memory device 201*a* to perform the write operation or the read operation. The control logic circuit 210 may include a command decoder 211 that decodes the command CMD received from the memory controller 25 through the control device 500 and a mode register 212 that sets an operation mode of the semiconductor memory device 201*a*.

For example, the command decoder 211 may generate the control signals corresponding to the command CMD by decoding a write enable signal, a row address strobe signal, a column address strobe signal, a chip select signal, etc.

Figure 4:
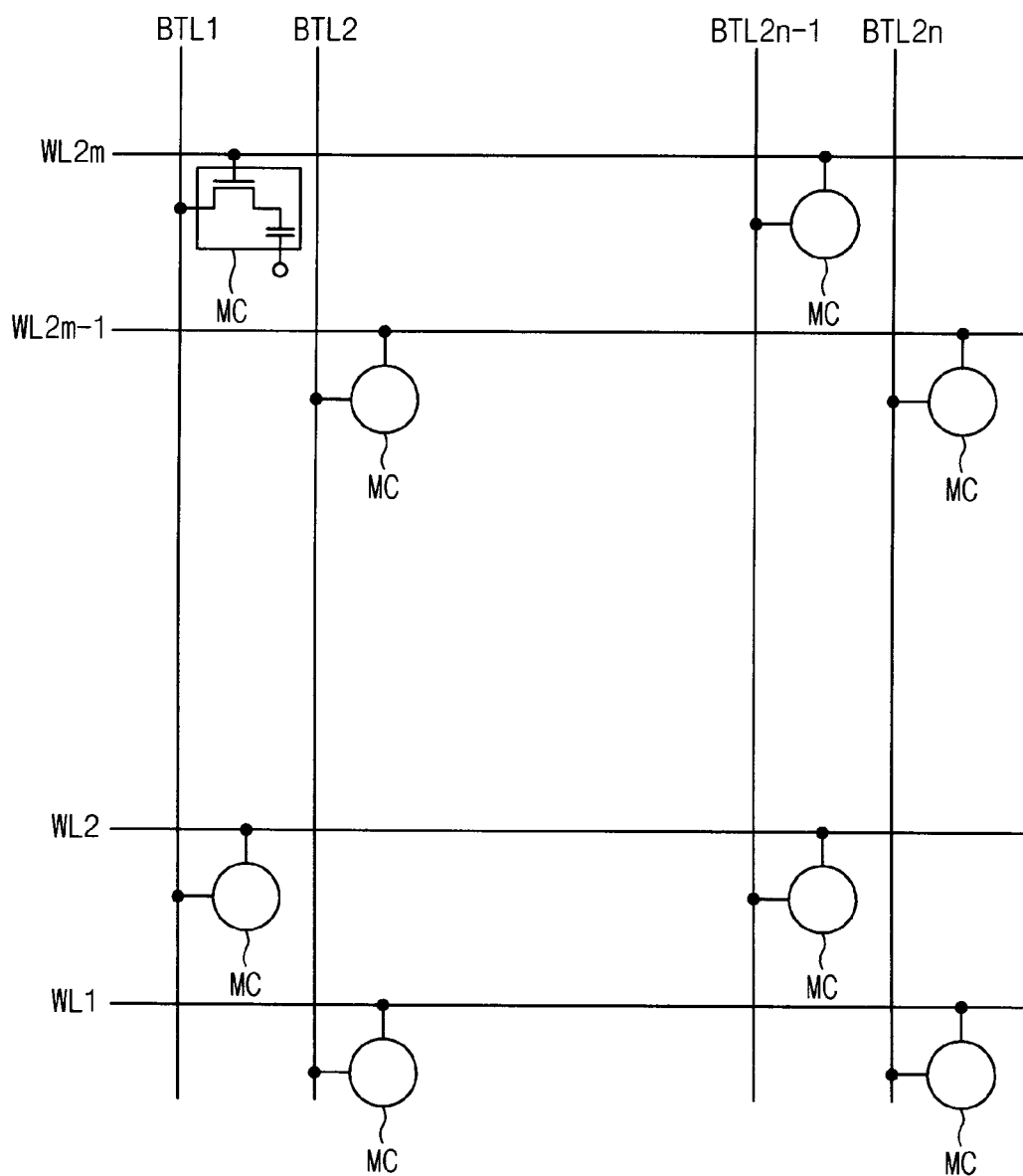
FIG. 4 illustrates a first bank array of the semiconductor memory device of FIG. 3 according to an exemplary embodiment of the present inventive concept.

FIG. 4 illustrates a first bank array of the semiconductor memory device of FIG. 3 according to an exemplary embodiment of the present inventive concept.

Referring to FIG. 4, the first bank array 310 includes a plurality of word-lines WL. The word-lines WL may comprise word-lines WL1, WL2, WL2*m*−1 and WL2*m* (where m is a positive integer greater than two), a plurality of bit-lines BTL. The bit-lines BTL may comprise bit-lines BTL1, BTL2, BTL2*n*−1 and BTL2*n* (where n is a positive integer greater than two), and a plurality of memory cells MC disposed near intersections between the word-lines WL and the bit-lines BTL. In an exemplary embodiment of the present inventive concept, each of the plurality of memory cells MC may include a DRAM cell structure. The plurality of word-lines W L to which the plurality of memory cells MC are connected may be referred to as rows of the first bank array 310 and the plurality of bit-lines BL to which the plurality of memory cells MC are connected may be referred to as columns of the first bank array 310.

Figure 5:
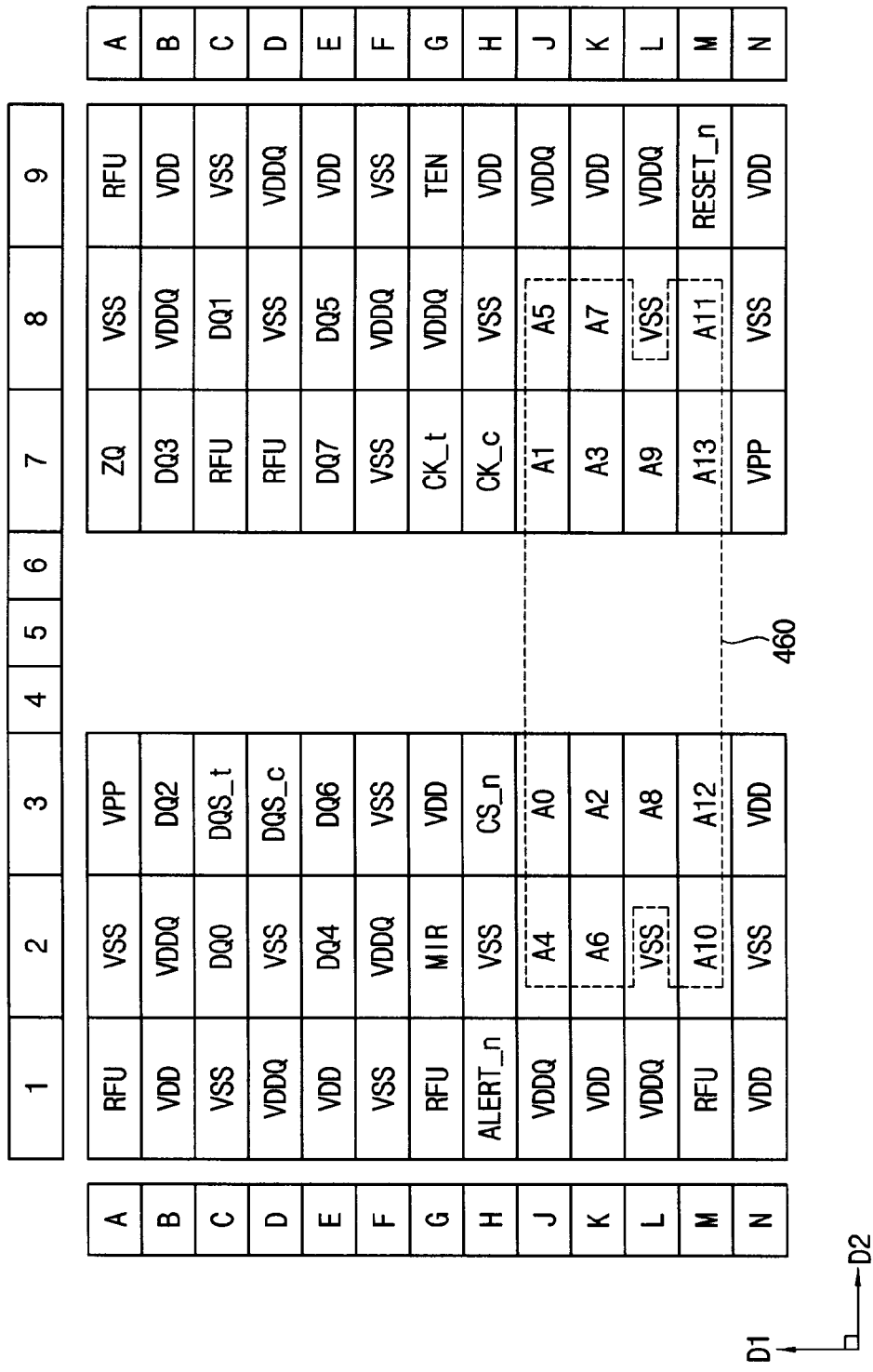
FIGS. 5 and 6 are diagrams illustrating a package ball assignment of each of the semiconductor memory devices in FIG. 2 according to an exemplary embodiment of the present inventive concept.
Figure 6:
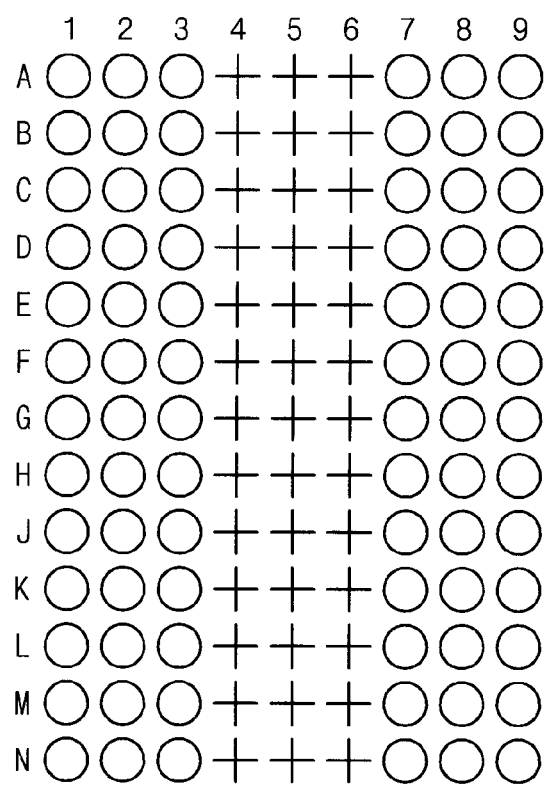
Figure 6:
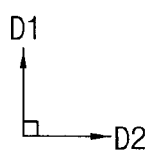

FIGS. 5 and 6 are diagrams illustrating a package ball assignment (e.g., a pin assignment) of each of the semiconductor memory device memory devices 201, 202, 203 and 204 in FIG. 2 according to exemplary embodiments of the present inventive concept.

Referring to FIGS. 5 and 6, each of the semiconductor memory devices 201, 202, and 204 has balls (e.g., a pin configuration) that are arranged in thirteen rows A, B, C, D, E, F, G, H, I, J, K, L, M, N, O, P each extending in the second direction (e.g., the D2 direction) and six columns 1, 2, 3, 4, 5, 6, 7, 8, 9, disposed in sets of three columns, each extending in the first direction (e.g., the D1 direction). For example, columns 1, 2 and 3 may be a first set. Columns 4, 5 and 6 may be a second set. Columns 7, 8 and 9 may be a third set. Non-populated columns 4, 5 and 6 are disposed between the two sets of columns. For example, the second set may be disposed between the first set and the third set. Balls are electrically populated with a power supply voltage, a ground voltage, a command CMD, an address ADDR, a clock signal CK, control signals, and data input/output signals.

For example, a ball MIR positioned at the row G and the column 2 may correspond to a mirroring function, a ball positioned at the row K and the column 3 may correspond to an address A2, and a ball positioned at the row K and the column 7 may correspond to an address A3. If the ball MIR positioned at the row G and the column 2 is connected to the power supply voltage, a corresponding semiconductor memory device operates in the mirrored mode, and if the ball MIR positioned at the row G and the column 2 is connected to the ground voltage, a corresponding memory device operates in the standard mode. In addition, a ball VPP positioned at the row A and the column 3 may correspond to memory activating power supply, a ball ZQ positioned at the row A and the column 7 may correspond to a reference pin for impedance calibration, and a ball DQS_t positioned at the row C and the column 3 and a ball DQS_t positioned at the row C and the column 4 may correspond to data strobes. In addition, a ball ALERT_n positioned at the row H and the column 1 may correspond to alert function, a ball CS_n positioned at the row H and the column 3 may correspond to chip select function, and a ball CK_t positioned at the row G and the column 7 and a ball CK_c positioned at the row H and the column 7 may correspond to differential clock inputs. In addition, a ball TEN positioned at the row G and the column 9 may correspond to test mode enable function and a ball RESET_n positioned at the row M and the column 9 may correspond to reset function.

A region of address balls 460 may be provided amongst the plurality of balls. The region of address balls 460 may include balls corresponding to addresses A0, A1, A2, A3, A4, A5, A6, A7, A8, A9, A10, A11, A12 and A13. Even numbered balls and odd numbered balls may be disposed in separate portions of the region of address balls 460 with columns 4, 5 and 6 disposed therebetween. For example, each of the balls corresponding to even-numbered addresses A0, A2, A4, A6, A8, A10, and A12 may have a symmetric (mirrored) assignment with a respective ball corresponding an odd-numbered address A1, A3, A5, A7, A9, A11, and A13. In other words, the SAMC 400 may swap each of the even-numbered addresses A0, A2, A4, A6, A8, A10, and A12 to a corresponding one of the symmetric odd-numbered addresses A1, A3, A5, A7, A9, A11, and A13 in the mirrored mode, respectively.

In FIG. 5, 'RFU' denotes 'reserved for future use' and indicates an unassigned ball.

Figure 7:
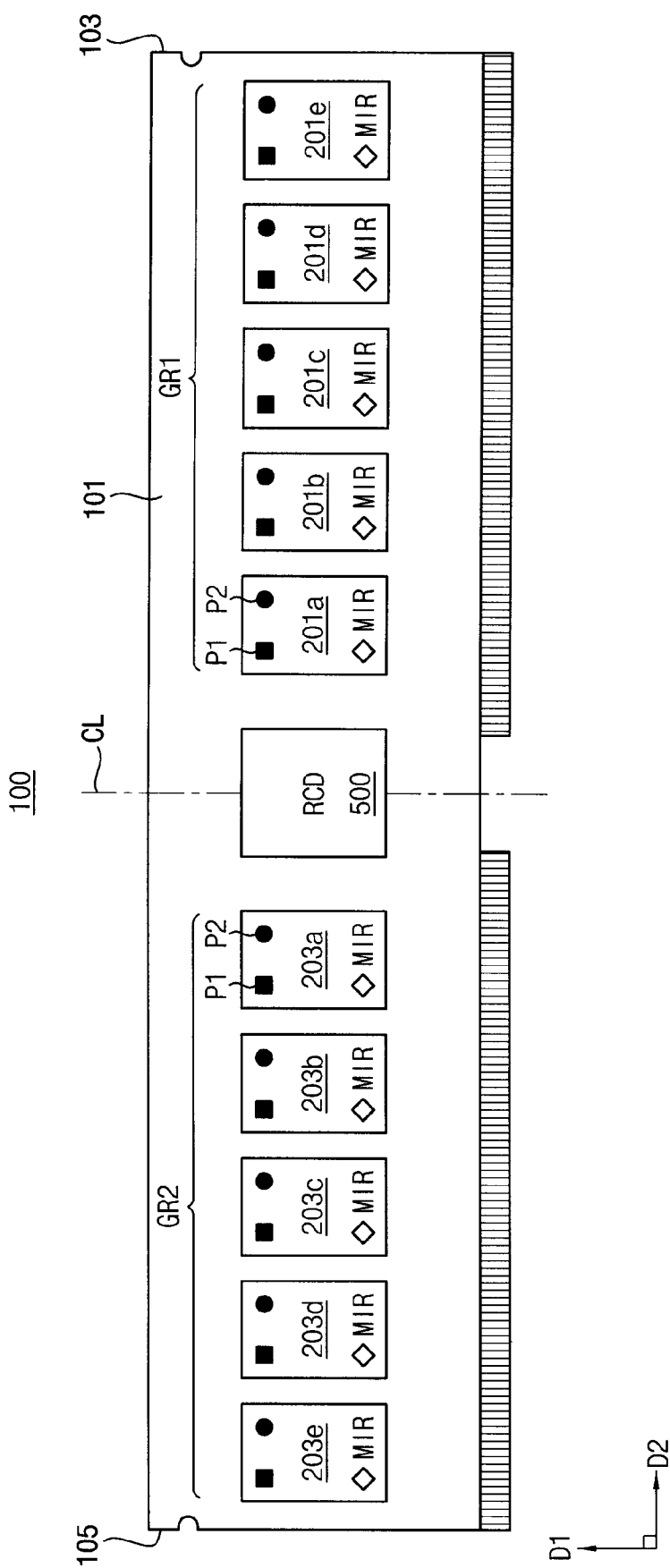
FIG. 7 illustrates the memory module of FIG. 2 according to an exemplary embodiment of the present inventive concept.

FIG. 7 illustrates the memory module of FIG. 2 according to an exemplary embodiment of the present inventive concept.

In FIG. 7, the semiconductor memory devices 201 disposed between the control device 500 and the first edge portion 103 are referred to as a first group GR1 of semiconductor memory devices and the memory devices 203 disposed between the control device 500 and the second edge portion 105 are referred to as a second group GR2 of semiconductor memory devices. Each of the semiconductor memory devices of the first group GR1 and the second GR2 has a mirror pin MIR and a pair of address pins P1 and P2 which are opposed to each other and have a mirrored configuration. For example, an address pin P1 of a semiconductor memory device 201 disposed in the first group GR1 may correspond to an address pin P2 of a semiconductor memory device 203 disposed in the second group GR2 and vice versa. The address pins P1 and P2 of a same semiconductor memory device 201 or 203 may be adjacent and spaced apart in the second direction (e.g., the D2 direction) and may be disposed at opposite edges of the same semiconductor memory device 201 or 203. In addition, the address pins P1 and P2 may be continuously alternately disposed across both the semiconductor memory devices 201 of the first group GR1 and the semiconductor memory devices 203 of the second group GR2. For example, the address pin P2 of the semiconductor memory device 203*a* and the address pin P1 of the semiconductor memory device 201*a* may be most adjacent address pins to the control device 500. The semiconductor memory devices 201 and 203 may have a plurality of pairs of address pins P1 and P2 having the mirrored configuration. A virtual center line CL disposed between the first group GR1 and the second group GR2 will be described in detail below.

Figure 8:
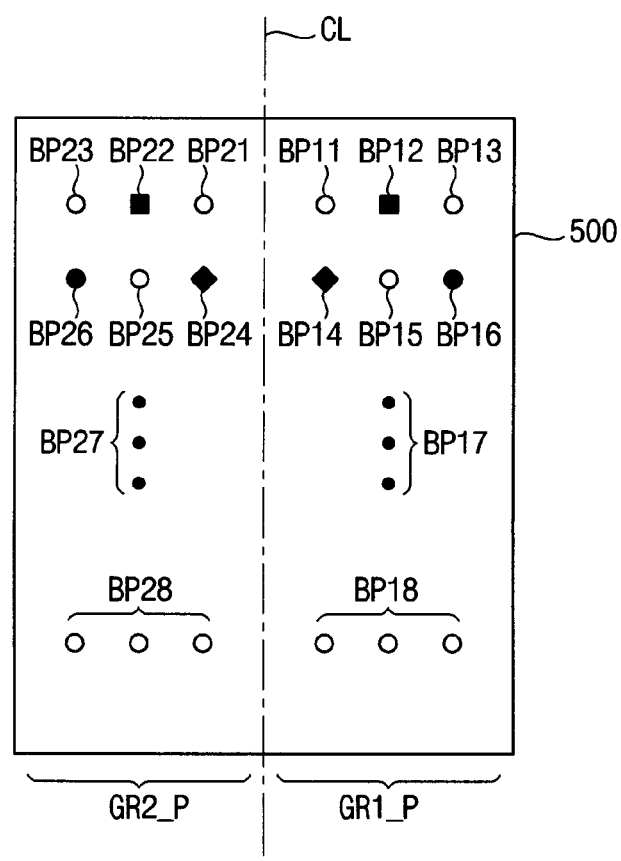
FIG. 8 illustrates a pin (ball) configuration of a control device in the memory module of FIG. 7 according to an exemplary embodiment of the present inventive concept.

FIG. 8 illustrates a pin (e.g., ball) assignment of a control device RCD 500 in the memory module 100 of FIG. 7 according to exemplary embodiments of the present inventive concept.

Referring to FIG. 8, the control device 500 may include a plurality of pins which are disposed symmetrically with respect to the virtual center line CL crossing the control device 500 in the first direction (e.g., the D1 direction). For example, the virtual center line CL may refer to an axis that extends in the first direction (e.g., the D1 direction) that bisects the memory module 100 and the control device 500.

Pins BP11, BP12, and BP13 are disposed symmetrically with pins BP21, BP22, and BP23, respectively, with respect to the virtual center line CL, and the pair of pins BP11 and BP21 transmit the same address signal to the first group GR1 of the semiconductor memory devices 201 and the second group GR2 of the semiconductor memory devices 203, respectively. Similar descriptions may be applied to pairs of pins BP12 and BP22, and BP13 and BP23. Pins BP14, BP15, and BP16 are disposed symmetrically with pins BP24, BP25, and BP26, respectively, with respect to the virtual center line CL, and each of the pairs of pins transmits the same signal to the first group GR1 of the semiconductor memory devices 201 and the second group GR2 of the semiconductor memory devices 203, respectively.

Pins BP17 are disposed symmetrically with pins BP27 with respect to the virtual center line CL, and pins BP18 are disposed symmetrically with pins BP28 with respect to the virtual center line CL. The pins BP11, BP12, BP13, BP14, BP15, BP16, BP17 and BP18 may be referred to herein as a first group of pins GR1_P because the pins BP11, BP12, BP13, BP14, BP15, BP16, BP17 and BP18 transmit signals to the first group GR1 of the semiconductor memory devices 201. The pins BP21, BP22, BP23, BP24, BP25, BP26, BP27 and BP28 may be referred to as a second group of pins GR2_P because the pins BP21, BP22, BP23, BP24, BP25, BP26, BP27 and BP28 transmit signals to the second group GR2 of the semiconductor memory devices 203.

Figure 9:
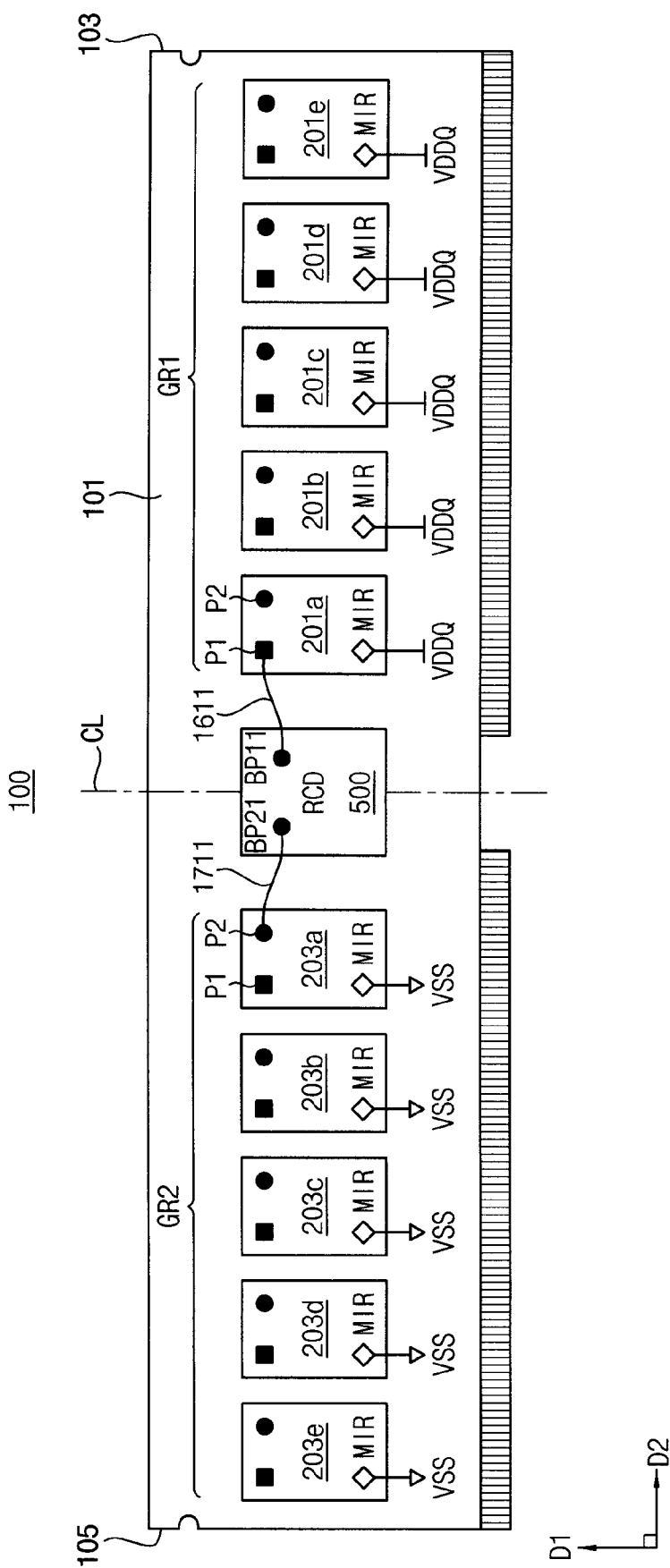
FIG. 9 illustrates that a first group of semiconductor memory devices operating in a mirrored mode in the memory module of FIG. 7 according to an exemplary embodiment of the present inventive concept.

FIG. 9 illustrates that the first group GR1 and the second group GR2 of semiconductor memory devices 201 and 203, respectively, operating in a mirrored mode in the memory module of FIG. 7 according to an exemplary embodiment of the present inventive concept.

Referring to FIG. 9, each mirror pin MIR of the first group GR1 of the semiconductor memory devices 201 is connected to a power supply voltage VDDQ and thus the first group GR1 of the semiconductor memory devices 201 operate in the mirrored mode, and each mirror pin MIR of the second group GR2 of the semiconductor memory devices 203 is connected to the ground voltage VSS and thus the second group GR2 of the semiconductor memory devices 203 operate in the standard mode. The first group GR1 of the semiconductor memory devices 201 may be referred to as a selected group of the semiconductor memory devices and the second group GR2 of the semiconductor memory devices 203 may be referred to as an unselected group of semiconductor memory devices.

The control device 500 applies a first address bit to the address pin P1 of each of the first group GR1 of the semiconductor memory devices 201 through a command/address transmission line 1611 and applies the first address bit to the address pin P2 of each of the second group GR2 of the semiconductor memory devices 203 through a command/address transmission line 1711. Since each of the first group GR1 of the semiconductor memory devices 201 operates in the mirrored mode, each of the first group GR1 of the semiconductor memory devices 201 changes the first address bit applied to the address pin P1 to a corresponding mirrored address bit and provides the mirrored address bit to each of the first group GR1 of the semiconductor memory devices 201.

Since each of the second group GR2 of the semiconductor memory devices 203 operates in the standard mode, each of the second group GR2 of the semiconductor memory devices 203 maintains the address bit applied to the address pin P2 and provides the maintained address bit to each of the second group GR2 of the semiconductor memory devices 203.

In FIG. 9, the command/address transmission lines 1611 and 1711 are routed symmetrically with respect to the virtual center line CL. In other words, the control device 500 may transmit the address signal ADDR to the first group GR1 of the semiconductor memory devices 201 and the second group GR2 of the semiconductor memory devices 203 through a first transmission line (e.g., the command/address transmission line 1611) and a second transmission line (e.g., the command/address transmission line 1711), respectively, which are physically symmetric with respect to the virtual center line CL.

Figure 10:
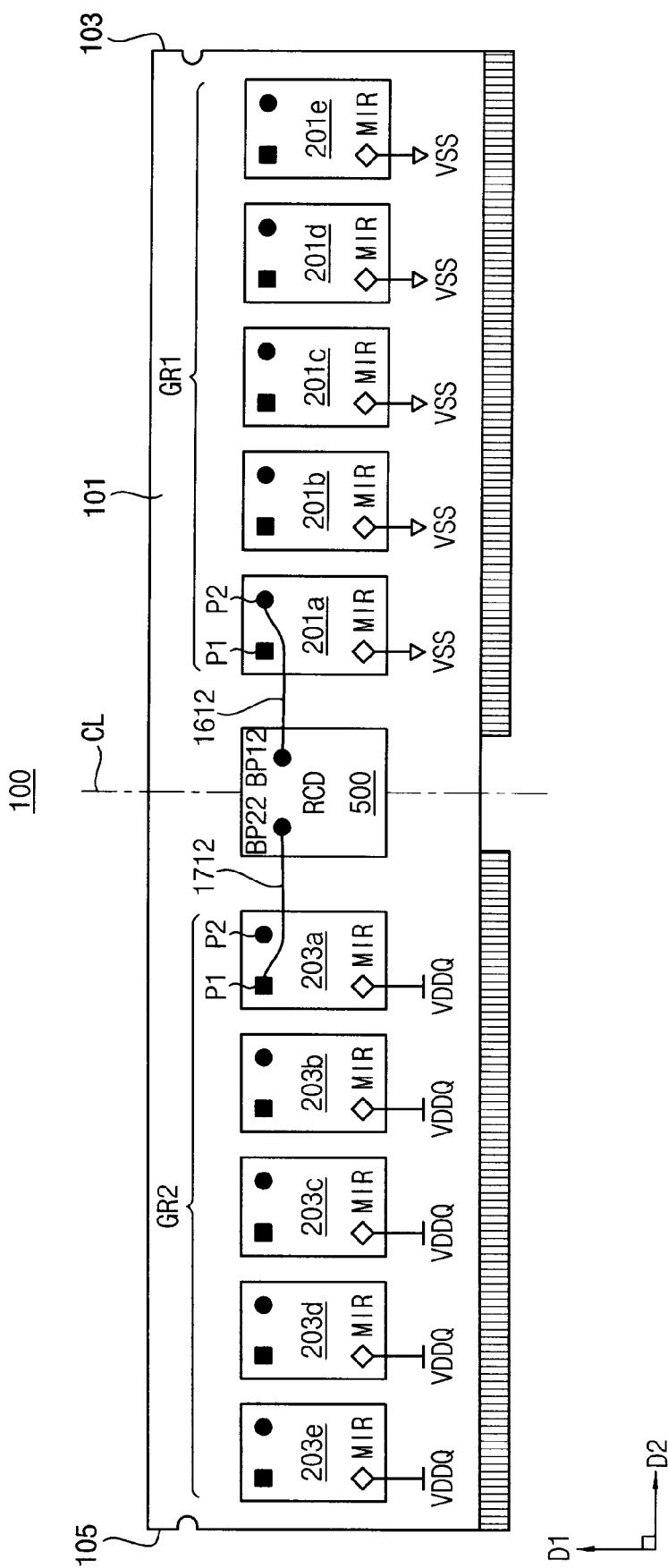
FIG. 10 illustrates a second group of semiconductor memory devices operating in the mirrored mode in the memory module of FIG. 7 according to an exemplary embodiment of the present inventive concept.

FIG. 10 illustrates a second group of semiconductor memory devices 203 operating in the mirrored mode in the memory module of FIG. 7 according to an exemplary embodiment of the present inventive concept.

Referring to FIG. 10, each mirror pin MIR of the first group GR1 of the semiconductor memory devices 201 is connected to the ground voltage VSS and thus the first group GR1 of the semiconductor memory devices 201 operate in the standard mode, and each mirror pin MIR of the second group GR2 of the semiconductor memory devices 203 is connected to the power supply voltage VDDQ and thus the second group GR2 of the semiconductor memory devices 203 operate in the mirrored mode.

The control device 500 applies a second address bit to the address pin P2 of each of the first group GR1 of the semiconductor memory devices 201 through a command/address transmission line 1612 and applies the second address bit to the address pin P1 of each of the second group GR2 of the semiconductor memory devices 203 through a command/address transmission line 1712. Since each of the second group GR2 of the semiconductor memory devices 203 operates in the mirrored mode, each of the second group GR2 of the semiconductor memory devices 203 changes the second address bit applied to the address pin P1 to a corresponding mirrored address bit and provides the mirrored address bit to each of the semiconductor memory devices 203 in the second group GR2. Since each of the first group GR1 of the semiconductor memory devices 201 operates in the standard mode, each of the first group GR1 of the semiconductor memory devices 201 maintains the address bit applied to the address pin P2 and provides the maintained address bit to each of the semiconductor memory devices 201 of the first group GR1.

In FIG. 10, the command/address transmission lines 1612 and 1712 are routed symmetrically with respect to the virtual center line CL.

Figure 11:
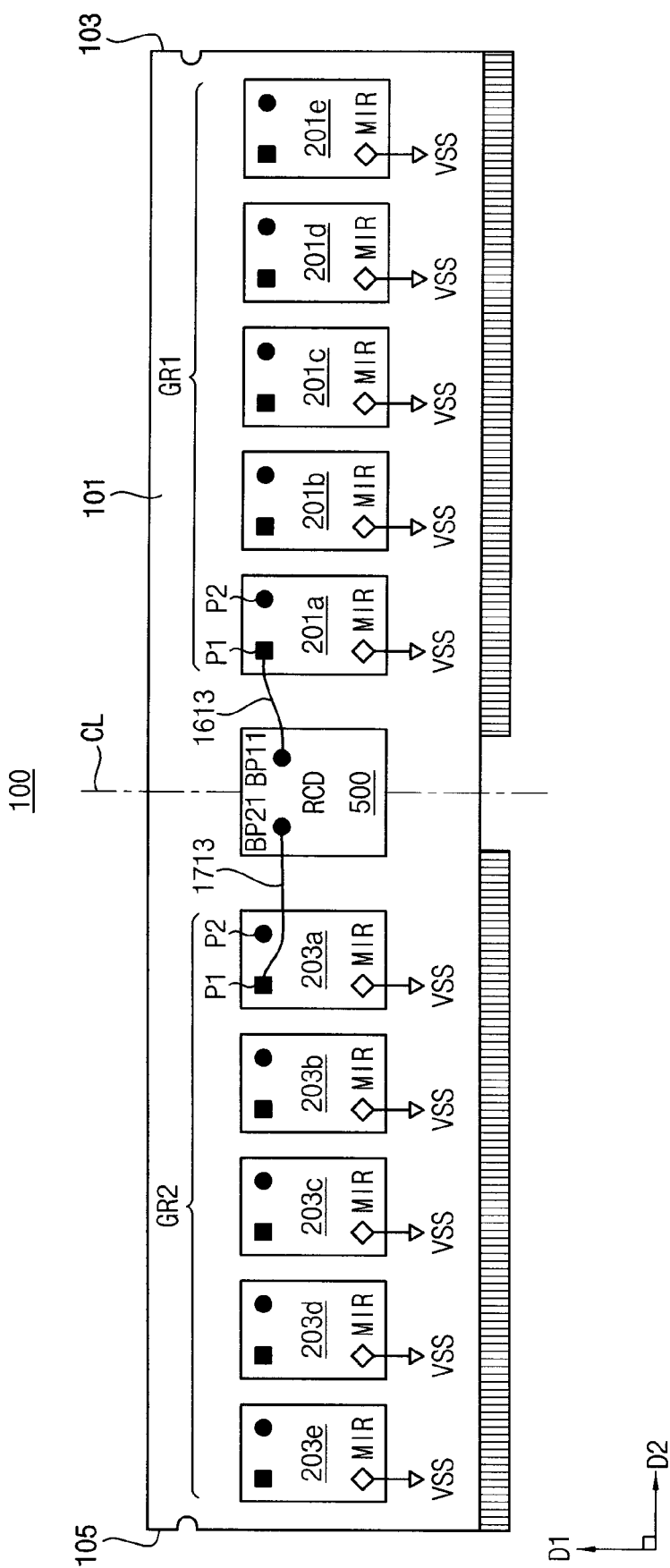
FIG. 11 illustrates the first group of semiconductor memory devices and the second group of semiconductor memory devices operating in a standard mode in the memory module of FIG. 7 according to an exemplary embodiment of the present inventive concept.

FIG. 11 illustrates the first group GR1 of semiconductor memory devices and the second group GR2 of semiconductor memory devices operating in a standard mode in the memory module 100 of FIG. 7 according to an exemplary embodiment of the present inventive concept.

Referring to FIG. 11, each mirror pin MIR of the first group GR1 of the semiconductor memory devices 201 is connected to the ground voltage VSS and thus the first group GR1 of the semiconductor memory devices 201 operate in the standard mode, and each mirror pin MIR of the second group GR2 of the semiconductor memory devices 203 is connected to the ground voltage VSS and thus the second group GR2 of the semiconductor memory devices 203 also operate in the standard mode.

The control device 500 applies a second address bit to the address pin P1 of each of the first group GR1 of the semiconductor memory devices 201 through a command/address transmission line 1613 and applies the first address bit to the address pin P1 of each of the second group GR2 of the semiconductor memory devices 203 through a command/address transmission line 1713.

Each of the first group GR1 of the semiconductor memory devices 201 operates in the standard mode and each of the second group GR2 of the semiconductor memory devices 203 operates in the standard mode. Therefore, the command/address transmission lines 1613 and 1713 are routed asymmetrically with respect to the virtual center line CL. For example, the transmission line 1713 may be comparatively longer than the transmission line 1613. In addition, the transmission line 1713 may be connected at one end to the BP21 and to the address pin P1 of the semiconductor memory device 203a at a second end. The transmission line 1613 may be connected at one end to the BP11 and to the address pin P1 of the semiconductor memory device 201a at a second end. FIG. 11 is a comparative example.

Figure 12:
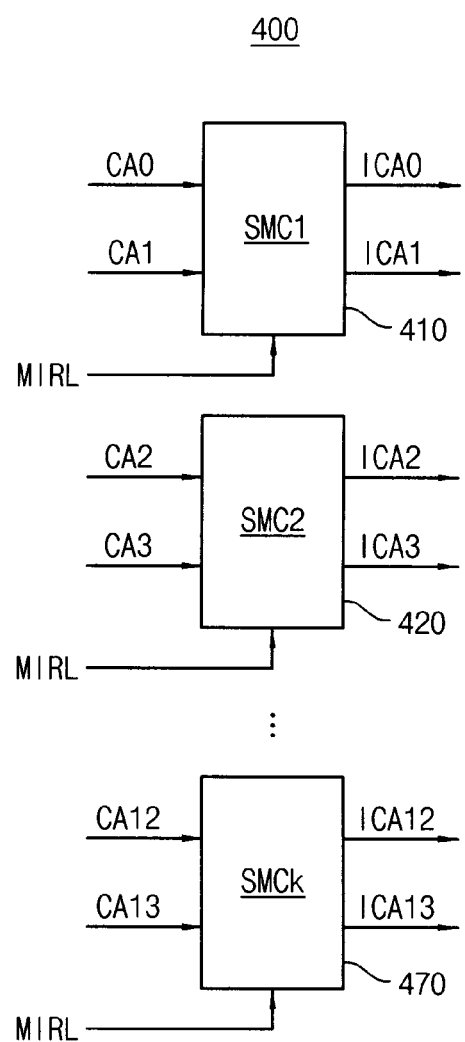
FIG. 12 is a block diagram illustrating a selective address mirroring circuit (SAMC) in the semiconductor memory device of FIG. 3 according to an exemplary embodiment of the present inventive concept.

FIG. 12 is a block diagram illustrating a selective address mirroring circuit (SAMC) in the semiconductor memory device 201a of FIG. 3 according to an exemplary embodiment of the present inventive concept. However, the present inventive concept is not limited thereto. For example, at least one of each of the first group GR1 and the second group GR2 of semiconductor devices 200 may include a selective address mirroring circuit (SAMC).

Referring to FIG. 12, the SAMC 400 may include a plurality of sub-address mirroring circuits SMC1, SMC2, and SMCk also referred to herein as sub-address mirroring circuits 410, 420, and 470.

The SMC1 410 receives address bits CA comprising address bits CA0 and CA1 constituting a mirroring pair, swaps or maintains the address bits CA0 and CA1 based on the voltage level MIRL of the mirror pin MIR, and outputs internal address bits ICA comprising address bits ICA0 and ICA1. The SMC1 410 outputs the internal address bits ICA0 and ICA1 by swapping the address bits CA0 and CA1 in the mirrored mode or maintaining the address bits CA0 and CA1 in the standard mode. For example, when the mirror pin MIR is connected to a power supply voltage VDDQ, the sub-address mirroring circuit SMC1 410 is configured to swap the first address bit CA0 and the second address bit CA1 to provide the second address bit CA1 and the first address bit CA0 as the first internal address bit ICA0(CA1) and the second internal address bit ICA1(CA0), respectively. The first address bit CA0 corresponds to an even numbered bit of a column address of the address signal ADDR, and the second address bit CA1 corresponds to a next higher odd numbered bit of the column address.

The SMC2 420 receives address bits CA2 and CA3 constituting a mirroring pair, swaps or maintains the address bits CA2 and CA3 based on the voltage level MIRL of the mirror pin MIR, and outputs internal address bits ICA2 and ICA3.

The SMCk 470 receives address bits CA12 and CA13 constituting a mirroring pair, swaps or maintains the address bits CA12 and CA13 based on the voltage level MIRL of the mirror pin MIR, and outputs internal address bits ICA12 and ICA13.

Figure 13:
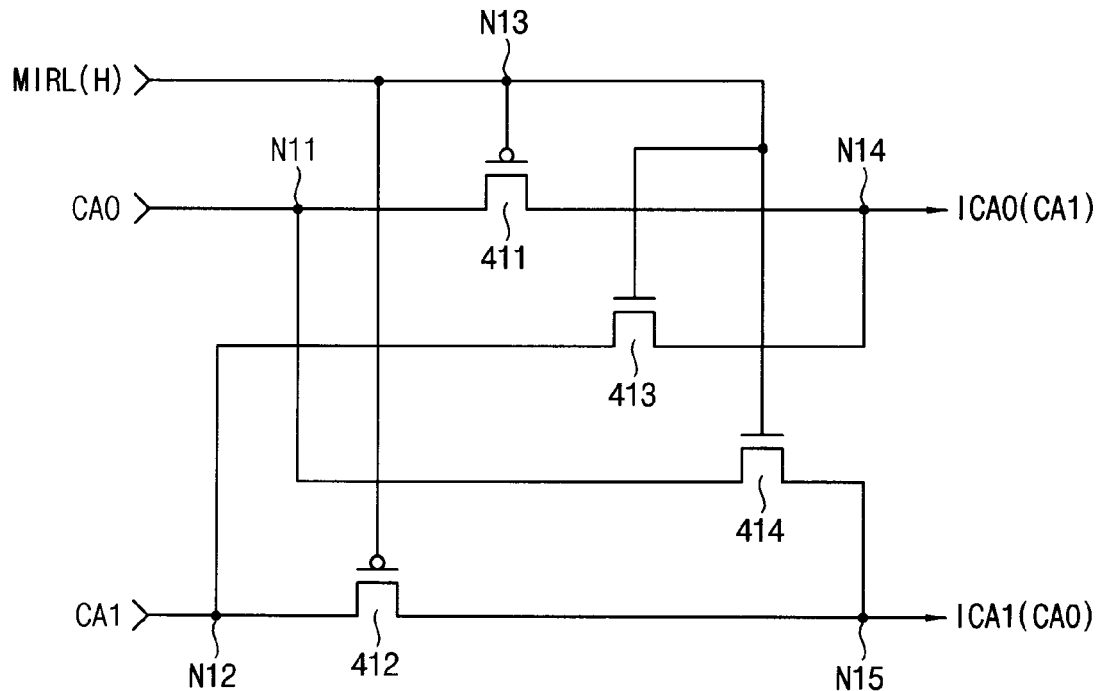
FIG. 13 illustrates an operation of a first sub-address mirroring circuit (SMC1) in the SAMC in FIG. 12 when a voltage level of mirror pins is a high level according to an exemplary embodiment of the present inventive concept.

FIG. 13 illustrates an operation of a first sub-address mirroring circuit (SMC1) in the SAMC in FIG. 12 when a voltage level of mirror pins MIR is a high level according to an exemplary embodiment of the present inventive concept.

Each configuration of the SMC2 and SMCk (420 and 470) may be substantially the same as a configuration of the SMC1 410. In FIG. 13, it is assumed that the voltage level MIRL of the mirror pins is a high level.

Referring to FIG. 13 the SMC1 (410) includes p-channel metal oxide semiconductor (PMOS) transistors 411 and 412 and n-channel metal oxide semiconductor (NMOS) transistors 413 and 414.

The PMOS transistor 411 has a first electrode which is connected to a first node N11 and receives the address bit CA0, a gate which is connected to a third node N13 and receives the voltage level MIRL of the mirror pin MIR, and a second electrode which is connected to a fourth node N14 and provides the internal address bit ICA0 corresponding to address bit CA1. The PMOS transistor 412 has a first electrode which is connected to a second node N12 and receives the address bit CA1, a gate which is connected to the third node N13 and receives the voltage level MIRL of the mirror pin MIR, and a second electrode which is connected to a fifth node N15 and provides the internal address bit ICA1 corresponding to address bit CA0.

The NMOS transistor 413 has a first electrode which is connected to the second node N12 and receives the address bit CA1, a gate which is connected to the third node N13 and receives the voltage level MIRL of the mirror pin MIR, and a second electrode which is connected to the fourth node N14. The NMOS transistor 414 has a first electrode which is connected to the first node N11 and receives the address bit CA0, a gate which is connected to the third node N13 and receives the voltage level MIRL of the mirror pin MIR, and a second electrode which is connected to the fifth node N15.

If the voltage level MIRL of the mirror pin MIR is a high level 'H', the PMOS transistors 411 and 412 are turned-off and the NMOS transistors 413 and 414 are turned-on. Therefore, the SMC1 410 swaps address bits CA0 and CA1 constituting a mirroring pair, outputs the address bit CA1 as the internal address bit ICA0, and outputs address bit CA0 as the internal address bit ICA1. The voltage level MIRL of the mirror pin MIR denotes a voltage level of the mirror pin MIR.

Figure 14:
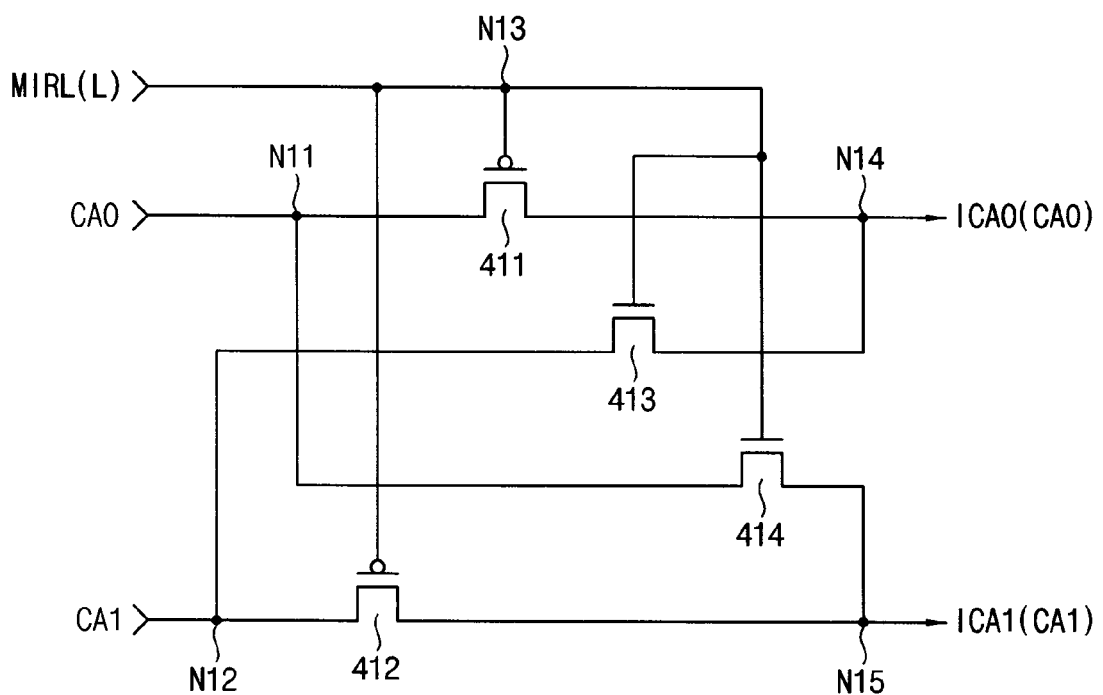
FIG. 14 illustrates an operation of the SMC1 when the voltage level of the mirror pins is a low level according to an exemplary embodiment of the present inventive concept.

FIG. 14 illustrates an operation of the SMC1 when the voltage level of the mirror pin MIR is a low level according to an exemplary embodiment of the present inventive concept.

Referring to FIG. 14, if the voltage level MIRL of the mirror pin is a low level 'L', the PMOS transistors 411 and 412 are turned-on and the NMOS transistors 413 and 414 are turned-off. Therefore, the SMC1 410 maintains address bits CA0 and CA1 constituting a mirroring pair, outputs the address bit CA0 as the internal address bit ICA0, and outputs address bit CA1 as the internal address bit ICA1.

Figure 15:
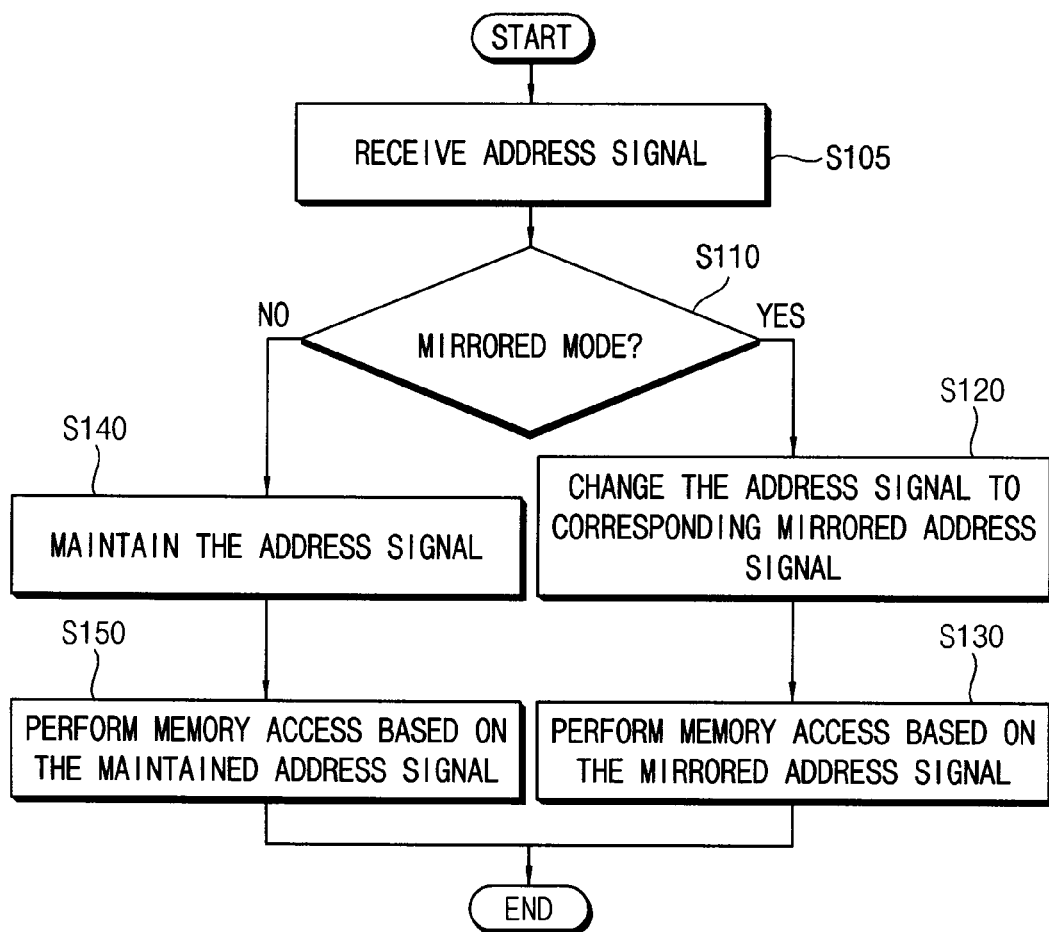
FIG. 15 is a flow chart illustrating a method of operating a memory module according to an exemplary embodiment of the present inventive concept.

FIG. 15 is a flow chart illustrating a method of operating a memory module 100 according to an exemplary embodiment of the present inventive concept.

Referring to FIG. 15, there is provided a method of operating a memory module 100 according to an exemplary embodiment of the present inventive concept. The memory module 100 includes a plurality of semiconductor memory devices 200 mounted on a circuit board 101 and a control device 500 to control the semiconductor memory devices 200. The control device 500 is disposed on a center of the circuit board 101. The semiconductor memory devices 200 include a first group of semiconductor memory devices 201 and/or 202 which are disposed between the control device 500 and a first edge portion 103 of the circuit board 101 and a second group of semiconductor memory devices 203 and/or 204 which are disposed between the control device 500 and a second edge portion 105 of the circuit board 101.

The first group of semiconductor memory devices 201 and/or 202 and the second group of semiconductor memory devices 203 and/or 204 receive the address signal ADDR through the control device 500 in operation S105.

It is determined whether one group of the first group of semiconductor memory devices 201 and/or 202 and the second group of semiconductor memory devices 203 and/or 204 operate in a mirrored mode in operation S110.

If a mirror pin MIR of each of the first group of semiconductor memory devices 201 and/or 202 is connected to a power supply voltage VDDQ and each of the first group of semiconductor memory devices 201 and/or 202 operates in the mirrored mode (YES in S110), each of the first group of semiconductor memory devices 201 and/or 202 changes the address signal ADDR to a corresponding mirrored address signal in operation S120. In other words, an SAMC 400 in each of the first group of semiconductor memory devices 201 and/or 202 swaps address bit pairs CA to output internal address bits ICA.

Each of the first group of semiconductor memory devices 201 and/or 202 performs a memory access operation on a memory cell array 300 based on the mirrored address signal (i.e., the changed address bits) in operation S130.

If a mirror pin MIR of each of the second group of semiconductor memory devices 203 and/or 204 is connected to a ground voltage VSS and each of the second group of semiconductor memory devices 203 and/or 204 operates in the standard mode (NO in S110), each of the second group of semiconductor memory devices 203 and/or 204 maintains the address signal ADDR to output the maintained address signal S140.

Each of the second group of semiconductor memory devices 203 and/or 204 performs a memory access operation on a memory cell array 300 based on the maintained address signal (i.e., the unchanged address bits) in operation S150.

Figure 16:
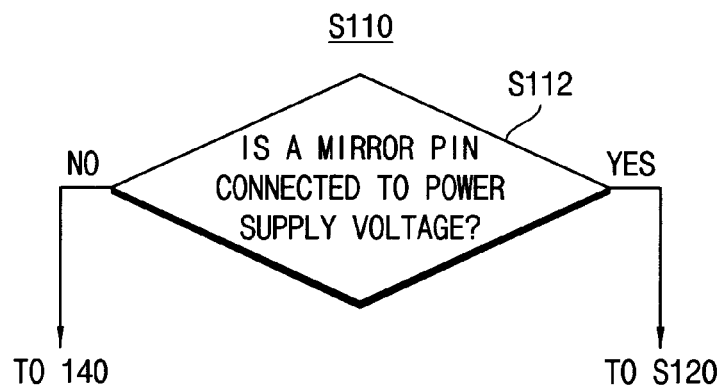
FIG. 16 is a flow chart illustrating an operation for determining whether one group of the first group of semiconductor memory devices and the second group of semiconductor memory devices operate in the mirrored mode according to an exemplary embodiment of the present inventive concept.

FIG. 16 is a flow chart illustrating an operation of determining whether one group of the first group of semiconductor memory devices 201 or 202 and the second group of semiconductor memory devices 203 or 204 operate in the mirrored mode.

Referring to FIG. 16 for determining whether one group of the first group of semiconductor memory devices 201 or 202 and the second group of semiconductor memory devices 203 or 204 operate in the mirrored mode (S110), it is determined whether each mirror pin MIR of the first group of semiconductor memory devices 201 or 202 and the second group of semiconductor memory devices 203 or 204 is connected to the power supply voltage VDDQ in operation S112.

If each mirror pin MIR of the first group of semiconductor memory devices 201 and 202 is connected to the power supply voltage VDDQ (YES in S112), each of the first group of semiconductor memory devices 201 and 202 operates in the mirrored mode. If each mirror pin MIR of the second group of semiconductor memory devices is connected to the ground voltage VSS (YES in S112), each of the second group of semiconductor memory devices 203 and 204 operates in the standard mode.

Figure 17:
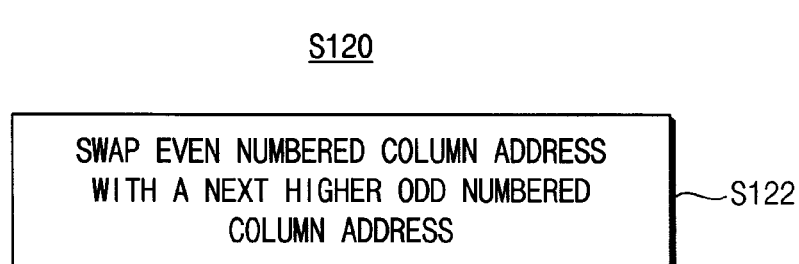
FIG. 17 is a flow chart illustrating an operation of changing the address signal in each of the semiconductor memory devices which operate in the mirrored mode in FIG. 15 according to an exemplary embodiment of the present inventive concept.

FIG. 17 is a flow chart illustrating an operation of changing the address signal ADDR in each of the semiconductor memory devices 200 which operate in the mirrored mode in FIG. 15.

Referring to FIG. 17, for changing the address signal ADDR to a corresponding mirrored address signal (S120), the SAMC 400 in each of the semiconductor memory devices 200 which operate in the mirrored mode swaps an even numbered column address of the address signal ADDR with a next higher odd numbered column address of the address signal ADDR in operation S122.

Figure 18:
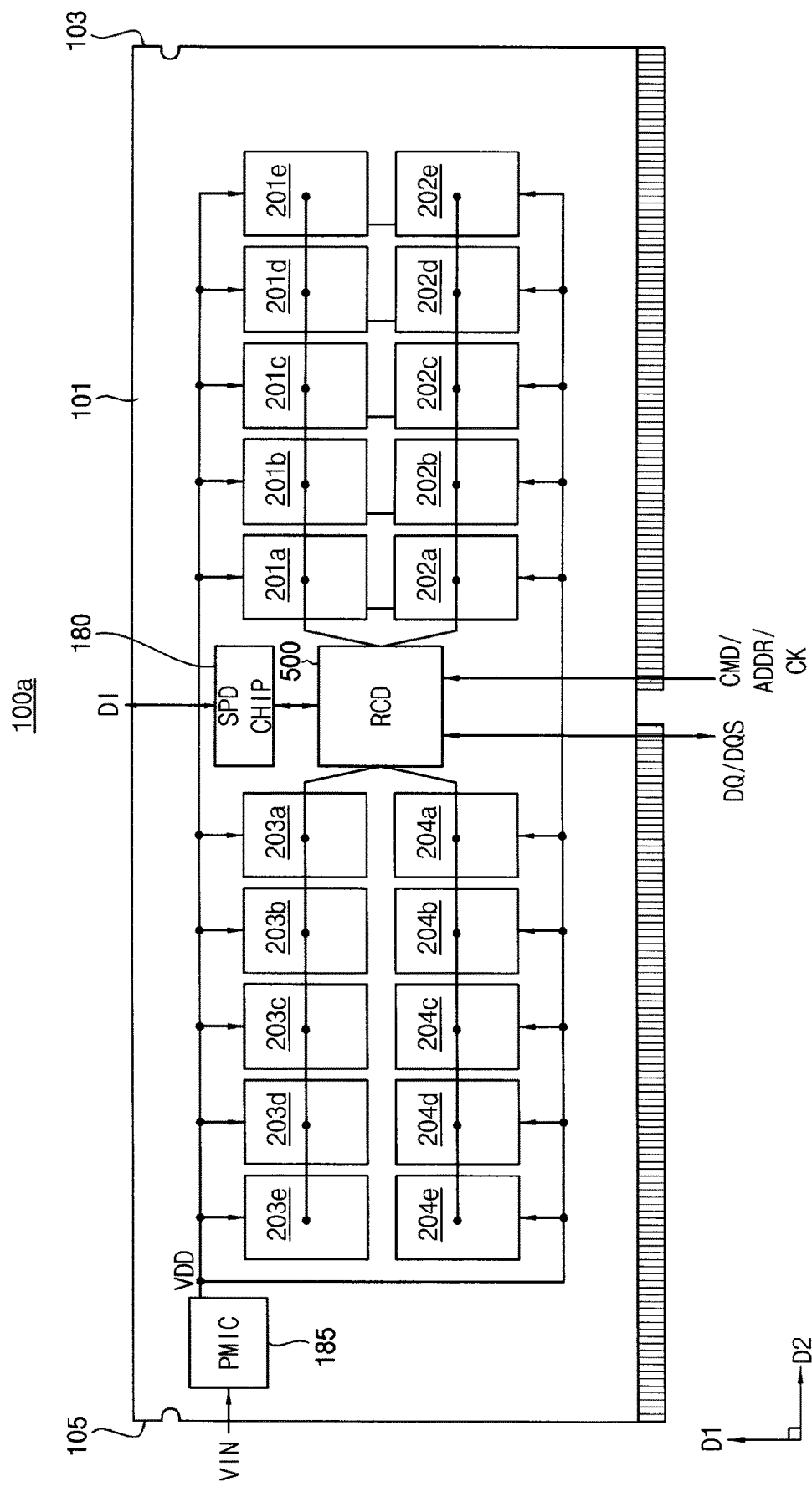
FIG. 18 is a block diagram illustrating a memory module in FIG. 1 according to an exemplary embodiment of the present inventive concept.

FIG. 18 is a block diagram illustrating a memory module 100 in FIG. 1 according to an exemplary embodiment of the present inventive concept.

A memory module 100a of FIG. 18 differs from the memory module 100 of FIG. 2 in that the memory module 100a does not include data buffers DB which receive/transmit the data signal DQ and the data strobe signal DQS from/to the plurality of semiconductor memory devices 201, 202, 203, and 204. The memory module 100a may receive/transmit the data signal DQ and the data strobe signal DQS from/to the memory controller 25 through the control device 500.

As described with reference to FIG. 2, each semiconductor memory device 200 in one group (i.e., a selected group) from the first group GR1 of semiconductor memory devices 201 and 202 and the second group GR2 of semiconductor memory devices 203 and 204, which operate in the mirrored mode, swaps an even numbered column address of the address signal ADDR with a next higher odd numbered column address of the address signal ADDR.

Therefore, a first command/address transmission line connected to the first group GR1 of semiconductor memory devices 201 and 202 and a second command/address transmission line connected to the second group GR2 of semiconductor memory devices 203 and 204, respectively, may be symmetrically routed with respect to the control device 500 in the memory module 100a. In other words, the first command/address transmission line and the second command/address transmission line may have a physically symmetric configuration with respect to the control device 500 in the memory module 100a. Therefore, signal transmission integrity may be enhanced in the memory module 100a.

Figure 19:
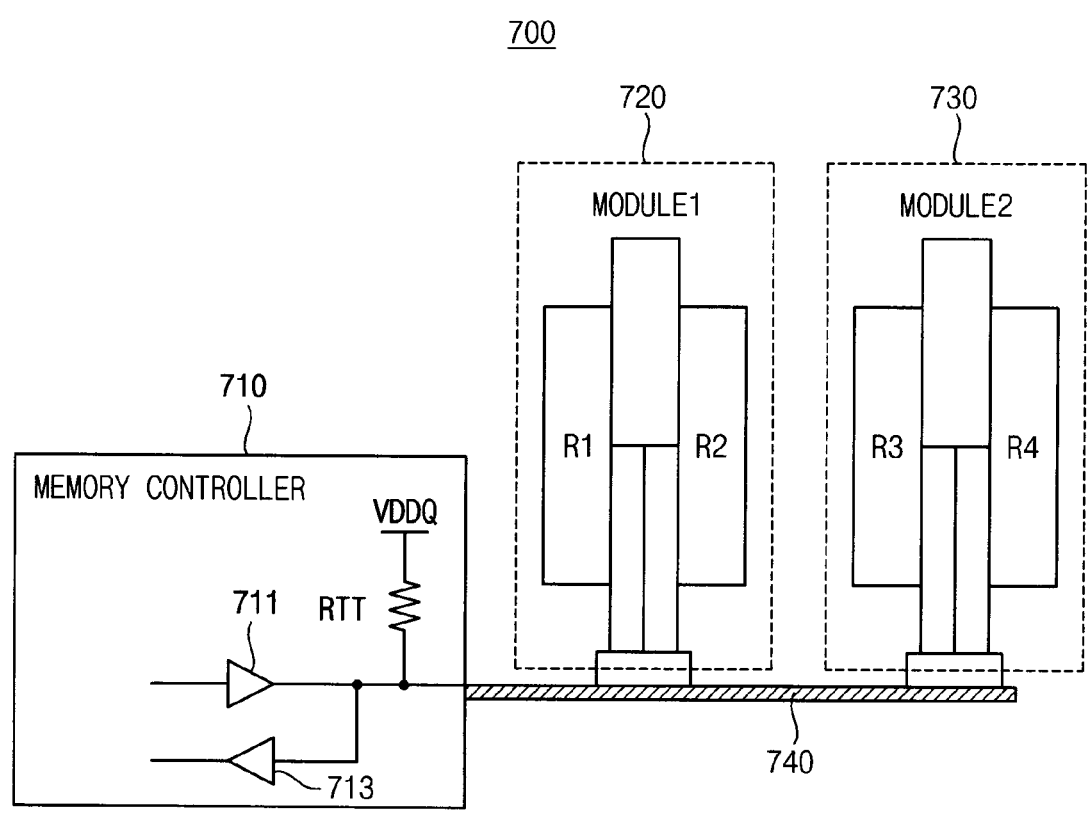
FIG. 19 is a block diagram illustrating a memory system having quad-rank memory modules according to an exemplary embodiment of the inventive concept.

FIG. 19 is a block diagram illustrating a memory system having quad-rank memory modules according to an exemplary embodiment of the present inventive concept.

Referring to FIG. 19, a memory system 700 may include a memory controller 710 and at least one or more memory modules 720 and 730.

The memory controller 710 may control a memory module 720 and/or 730 so as to perform a command CMD supplied from a processor or host. The memory controller 710 may be implemented in a processor or host, or may be implemented with an application processor or a system-on-a-chip (SoC). For signal integrity, a source termination may be implemented with a resistor RTT on a bus 740 of the memory controller 710. The resistor RTT may be coupled to a power supply voltage VDDQ. The memory controller 710 may include a transmitter 711, to transmit a signal to the at least one or more memory modules 720 and 730, and a receiver 713 to receive a signal from the at least one or more memory modules 720 and 730.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module 100 of FIG. 2 or the memory module 100a of FIG. 18. The first memory module 720 may include at least one or more memory ranks R1 and R2, and the second memory module 730 may include one or more memory ranks R3 and R4.

Each of the first memory module 720 and the second memory module 730 may include a control device such as the control device 500 disposed on a center of a circuit board such as the circuit board 101, a first group of semiconductor memory devices disposed between the control device and a first edge portion such as the first edge portion 103 of the circuit board and a second group of semiconductor memory devices disposed between the control device and a second edge portion of the circuit board.

When each mirror pin of semiconductor memory devices in a selected portion (group) from the first group of semiconductor memory devices and the second group of semiconductor memory devices is connected to the power supply voltage such as the power supply voltage VDDQ, each one of the semiconductor memory devices in the selected group operates in a mirrored mode to swap the address bit pair to output internal address bits. When each mirror pin of an unselected portion (group) of the first group of semiconductor memory devices and the second group of semiconductor memory devices is connected to the ground voltage, each one of the semiconductor memory devices in the unselected group operates in a standard mode to maintain the address bit pair. Therefore, first transmission lines such as the first transmission lines 161 or 163 and second transmission lines such as the second address/transmission lines 171 or 173 may be symmetrically routed with respect to the control device in each of the first memory module 720 and the second memory module 730.

Figure 20:
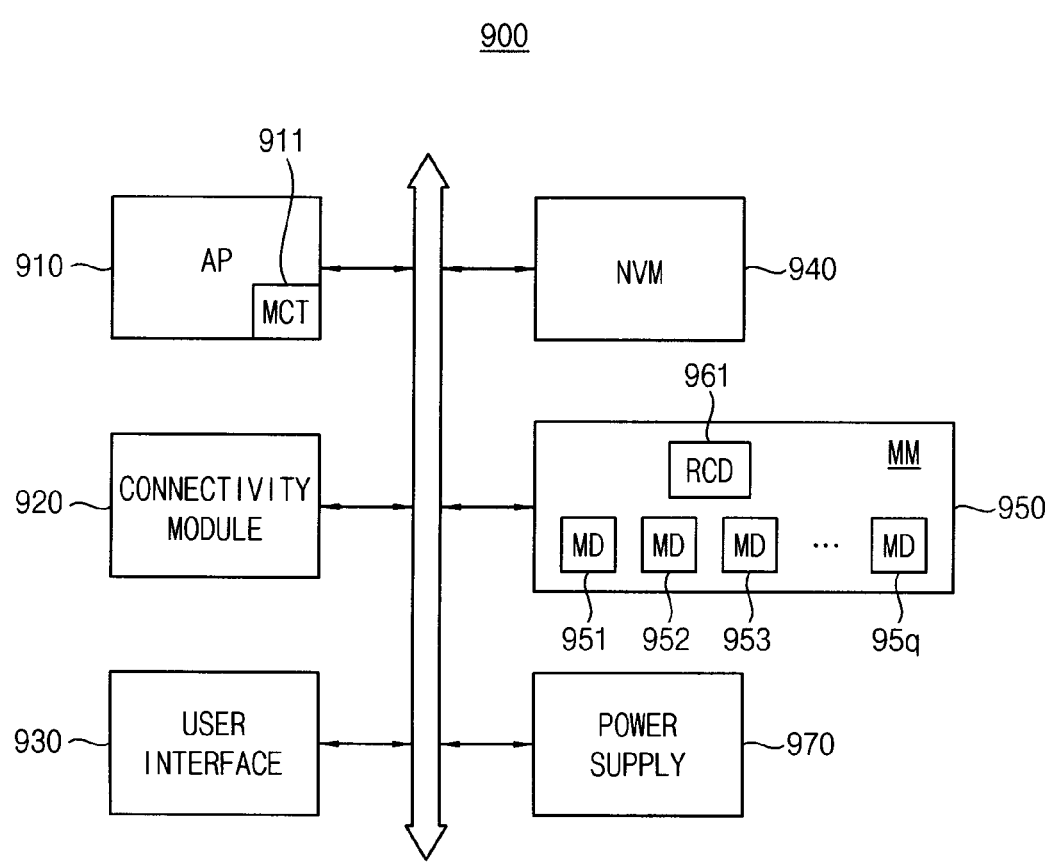
FIG. 20 is a block diagram illustrating a mobile system including a memory module according to an exemplary embodiment of the present inventive concept.

FIG. 20 is a block diagram illustrating a mobile system 900 including a memory module 950 according to an exemplary embodiment of the present inventive concept.

Referring to FIG. 20, a mobile system 900 may include an application processor 910, a connectivity module 920, a memory module 950, a nonvolatile memory device 940, a user interface 930, and a power supply 970. The application processor 910 may include a memory controller 911.

The application processor 910 may execute applications, such as a web browser, a game application, a video player, etc. The connectivity module 920 may perform wired or wireless communication with an external device.

The memory module (MM) 950 may store data processed by the application processor 910 or operate as a working memory. The memory module 950 may include a plurality of semiconductor memory devices (MD) 951, 952, 953, and 95q (where q is a positive integer greater than three), and a control device 961. The control device 961 may be disposed in a center of a circuit board such as the circuit board 101, and the semiconductor memory devices 951, 952, 953 and 95q may include a first group of semiconductor memory devices disposed between the control device 961 and a first edge portion such as the first edge portion 103 of a circuit board such as the circuit board 101 and a second group of semiconductor memory devices disposed between the control device 961 and a second edge portion such as the second edge portion 105 of the circuit board.

When each mirror pin such as the mirror pin MIR of semiconductor memory devices in a selected group of the first group of semiconductor memory devices and the second group of semiconductor memory devices is connected to a power supply voltage such as the power supply voltage VDDQ, each semiconductor memory device of in the selected portion (group) operates in a mirrored mode to swap an address bit pair such as the address bit pair CA for an internal address bit such as the internal address bit ICA. When each mirror pin of the semiconductor memory devices in the unselected portion (group) of the first group of semiconductor memory devices and the second group GR2 of semiconductor memory devices is connected to a ground voltage such as the ground voltage VSS, each one of the semiconductor memory devices in the unselected group operates in a standard mode to maintain an address bit pair such as the address bit pair CA. Therefore, first address transmission lines such as the first address transmission lines 161 and 163 and second address/transmission lines such as the second address/transmission lines 171 and 173 may be symmetrically routed with respect to the control device 961 in the memory module 950.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

In an exemplary embodiment of the present inventive concept, the mobile system 900 and/or components of the mobile system 900 may be packaged in various forms.

The present inventive concept as described above may be applied to systems using semiconductor memory modules.

Exemplary embodiments of the present inventive concept described heretofore provide for a memory module capable of transmitting address signals symmetrically, and also provide a method of operating the memory module capable of transmitting address signals symmetrically.

While exemplary embodiments of the present inventive concept have been shown and described above, it will be understood by those of ordinary skill in the art that various changes in form and details may be made therein without departing from the spirit and scope of the present inventive concept, as defined by the following claims.

What is claimed is:

1. A memory device, comprising:
   a memory cell array including a plurality of memory cells;
   a plurality of address pins configured to receive an address signal for a memory access operation on the memory cell array, the address signal including at least a first address bit and a second address bit;
   a mirror pin; and
   a selective address mirroring circuit configured to, based on a voltage level of the mirror pin, selectively swap the first address bit and the second address bit,
   wherein the first address bit and the second address bit constitute a mirroring pair.

2. The memory device of claim 1, wherein, in response to the mirror pin being connected to a power supply voltage, the selective address mirroring circuit is configured to receive the address signal in a mirrored mode.

3. The memory device of claim 2, wherein the selective address mirroring circuit is configured to swap the first address bit and the second address bit in the mirrored mode.

4. The memory device of claim 1, wherein, in response to the mirror pin being connected to a ground voltage, the selective address mirroring circuit is configured to receive the address signal in a standard mode.

5. The memory device of claim 4, wherein the selective address mirroring circuit is configured to maintain the first address bit and the second address bit in the standard mode.

6. The memory device of claim 1, wherein the selective address mirroring circuit includes a plurality of sub-address mirroring circuits, and each of the plurality of sub-address mirroring circuits receives the first address bit and the second address bit.

7. The memory device of claim 6, wherein each of the plurality of sub-address mirroring circuits is configured to selectively swap the first address bit and the second address bit based on the voltage level of the mirror pin.

8. A memory device, comprising:
   a memory cell array including a plurality of memory cells;
   a plurality of address pins configured to receive an address signal for a memory access operation on the memory cell array;
   a mirror pin; and
   a selective address mirroring circuit configured to, based on a voltage level of the mirror pin, selectively swap an even numbered address of the address signal with a next higher odd number address of the address signal.

9. The memory device of claim 8, wherein, in response to the mirror pin being connected to a power supply voltage, the selective address mirroring circuit is configured to receive the address signal in a mirrored mode.

10. The memory device of claim 9, wherein the selective address mirroring circuit is configured to swap the even numbered address of the address signal with the next higher odd number address of the address signal in the mirrored mode.

11. The memory device of claim 8, wherein, in response to the mirror pin being connected to a ground voltage, the selective address mirroring circuit is configured to receive the address signal in a standard mode.

12. The memory device of claim 11, wherein the selective address mirroring circuit is configured to maintain the address signal in the standard mode.

13. The memory device of claim 8, wherein the selective address mirroring circuit includes a plurality of sub-address mirroring circuits, and each of the plurality of sub-address mirroring circuits receives some bits of the address signal in units of a mirroring pair,
- wherein each of the plurality of sub-address mirroring circuits is configured to selectively swap a first address bit and a second address bit based on the voltage level of the mirror pin, and
- wherein the first address bit and the second address bit constitute the mirroring pair.

14. The memory module of claim 13, wherein:
the first address bit corresponds to an even number bit of a column address of the address signal, and
the second address bit corresponds to a next higher odd number bit of the column address.

15. A memory module, comprising:
a plurality of semiconductor memory devices mounted on a circuit board; and
a registered clock driver (RCD) mounted on the circuit board, and configured to provide a command signal, an address signal, and a clock signal to the plurality of semiconductor memory devices,
wherein a first group of the semiconductor memory devices is disposed between the RCD and a first edge portion of the circuit board and a second group of the semiconductor memory devices is disposed between the RCD and a second edge portion of the circuit board, wherein:
each of the first group of the semiconductor memory devices is configured to perform address swapping on the address signal and each of the second group of the semiconductor memory devices is configured to maintain the address signal, and
each mirror pin of the first group of the semiconductor memory devices is connected to a power supply voltage and each mirror pin of the second group of the semiconductor memory devices is connected to a ground voltage.

16. The memory module of claim 15, wherein:
each of the first group of the semiconductor memory devices is configured to receive the address signal from the RCD in a mirrored mode, and
each of the second group of the semiconductor memory devices is configured to receive the address signal from the RCD in a standard mode.

17. The memory module of claim 16, wherein:
each of the first group of the semiconductor memory devices is configured to swap a first address bit and a second address bit of the address signal in the mirrored mode, and
each of the second group of the semiconductor memory devices is configured to maintain the first address bit and the second address bit in the standard mode.

18. The memory module of claim 16, wherein:
each of the first group of the semiconductor memory devices is configured to swap an even numbered address of the address signal with a next higher odd number address of the address signal in the mirrored mode, and
each of the second group of the semiconductor memory devices is configured to maintain the address signal in the standard mode.

19. The memory module of claim 15, wherein each of the plurality of semiconductor memory devices is a double data rate 5 (DDR5) synchronous dynamic random access memory (SDRAM).

* * * * *